United States Patent
Nakamura et al.

(10) Patent No.: US 7,136,058 B2
(45) Date of Patent: Nov. 14, 2006

(54) DISPLAY APPARATUS, DIGITAL-TO-ANALOG CONVERSION CIRCUIT AND DIGITAL-TO-ANALOG CONVERSION METHOD

(75) Inventors: Takashi Nakamura, Kumagaya (JP); Hirotaka Hayashi, Fukaya (JP); Hisao Fujiwara, Ageo (JP); Masao Karube, Fukaya (JP); Kazuo Nakamura, Kitamoto (JP); Masakatsu Kitani, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 540 days.

(21) Appl. No.: 10/132,521

(22) Filed: Apr. 26, 2002

(65) Prior Publication Data

US 2002/0190971 A1   Dec. 19, 2002

(30) Foreign Application Priority Data

| Apr. 27, 2001 | (JP) | 2001-132969 |
| May 17, 2001 | (JP) | 2001-148175 |
| Oct. 22, 2001 | (JP) | 2001-323178 |
| Dec. 28, 2001 | (JP) | 2001-400089 |

(51) Int. Cl.
*G09G 5/00* (2006.01)

(52) U.S. Cl. .................. 345/211; 345/80; 345/87; 345/98; 345/100; 345/204; 345/205; 345/206; 345/212; 345/213; 330/127; 330/199; 330/250

(58) Field of Classification Search ............ 345/80, 345/87, 98, 100, 204–206, 211–213; 330/127, 330/199, 250
See application file for complete search history.

(56) References Cited

U.S. PATENT DOCUMENTS

| 5,519,344 | A | * | 5/1996 | Proebsting ............... 327/108 |
| 6,232,948 | B1 | * | 5/2001 | Tsuchi ..................... 345/99 |
| 6,275,207 | B1 | * | 8/2001 | Nitta et al. .............. 345/89 |
| 6,456,282 | B1 | * | 9/2002 | Karube ................... 345/204 |
| 6,756,962 | B1 | * | 6/2004 | Akimoto et al. .......... 345/98 |
| 2001/0035862 | A1 | * | 11/2001 | Nakamura et al. ........ 345/204 |

* cited by examiner

*Primary Examiner*—Richard Hjerpe
*Assistant Examiner*—Jennifer T. Nguyen
(74) *Attorney, Agent, or Firm*—Oblon, Spivak, McClelland, Maier & Neustadt, P.C.

(57) ABSTRACT

A signal line drive circuit according to the present invention has: a latch circuit which latches digital pixel data; a D/A converter which converts a latch output from the latch circuit into an analog video signal; an AMP which amplifies the analog video signal converted by the D/A converter; and a signal selection circuit which selects a signal line to which the analog video signal amplified by the AMP is supplied. The AMP has: an odd number of inverters which are cascade-connected; capacitor elements which are respectively connected between stages of the inverters and between an input terminal of the inverter on a first stage and an output terminal of the inverter on a last stage; a first power supply line which supplies a power supply voltage to the inverter on the first stage; and a second power supply line which supplies a power supply voltage to inverters other than the inverter on the first stage. The accuracy of the AMP can be improved by separating the power supply line for only the inverter on the first stage.

14 Claims, 31 Drawing Sheets

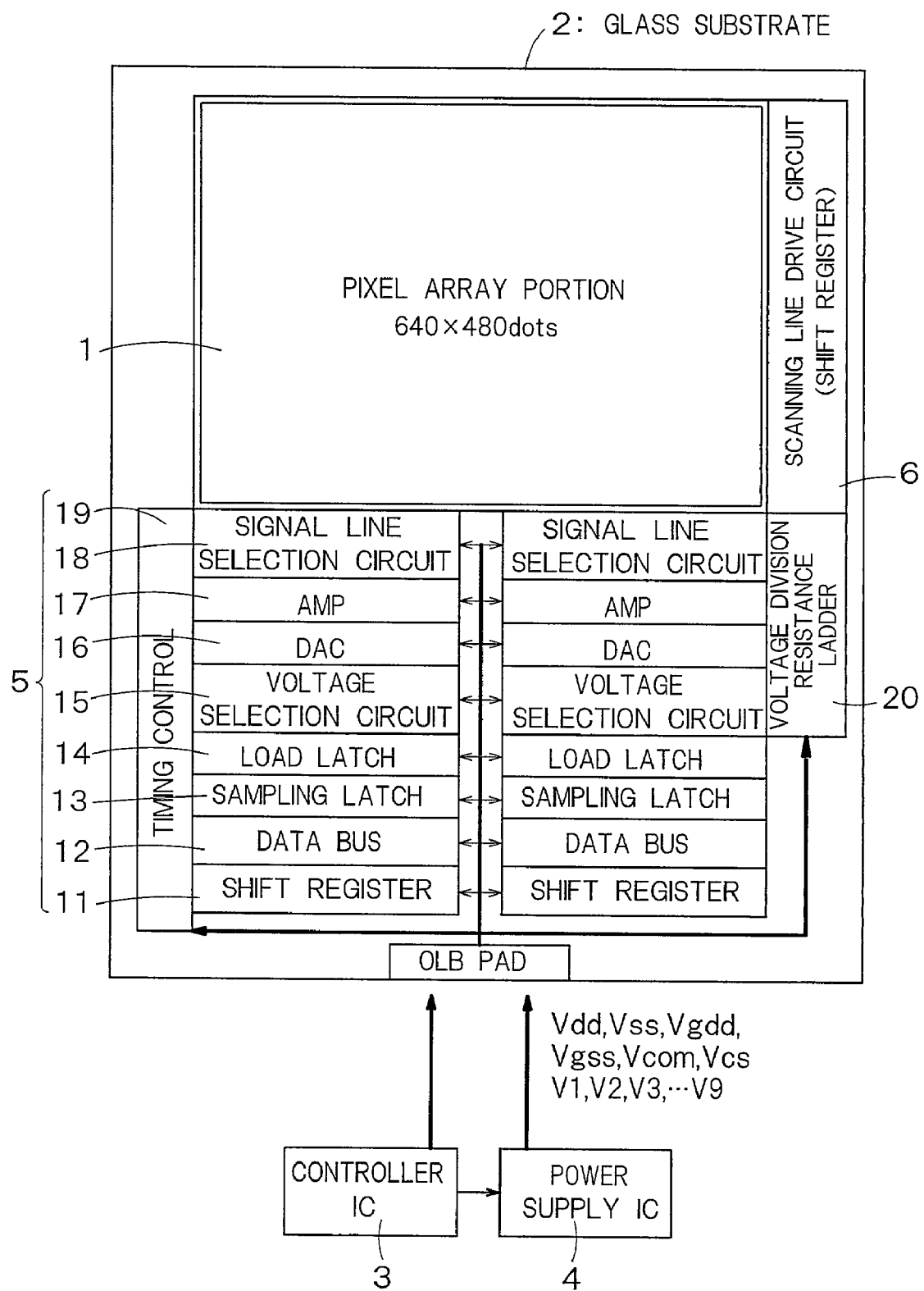
F I G. 1

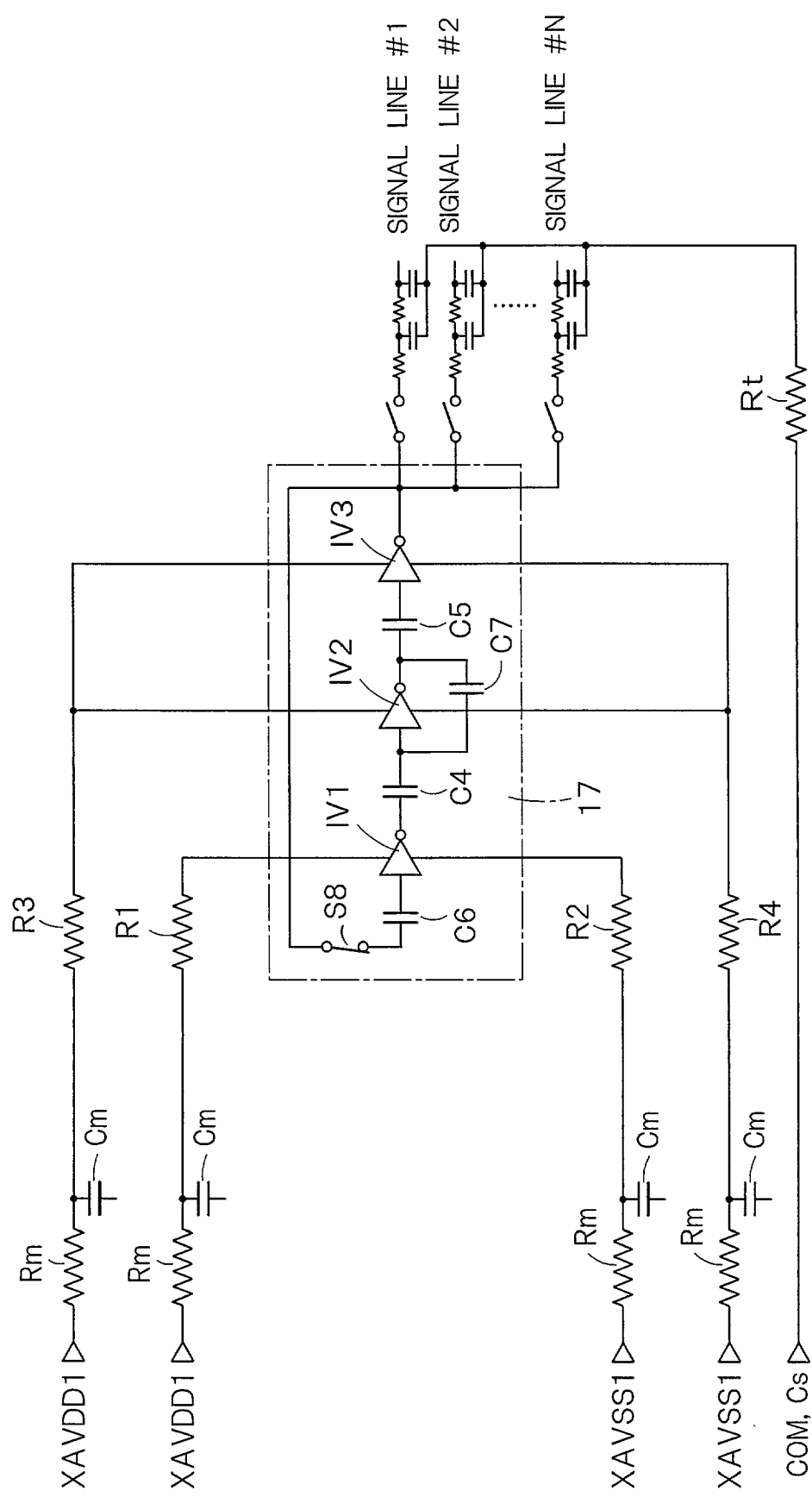
F I G. 5

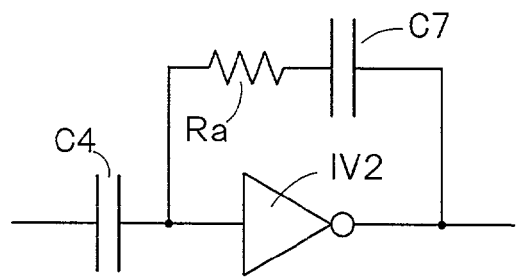
F I G. 10
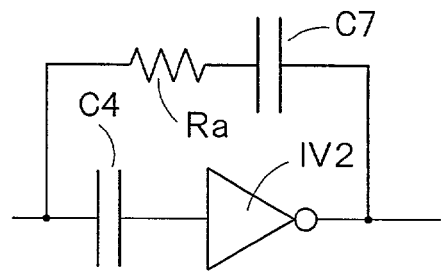
F I G. 11
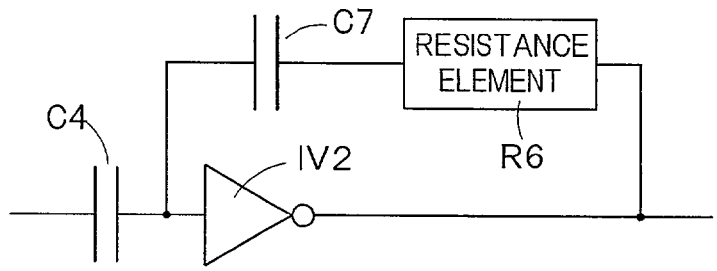
F I G. 12
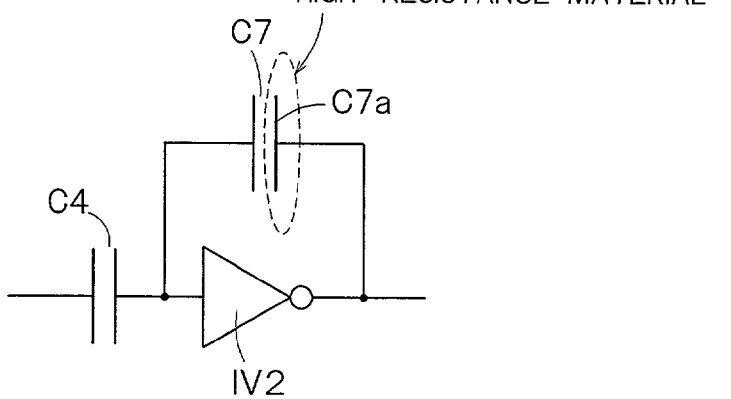
F I G. 13

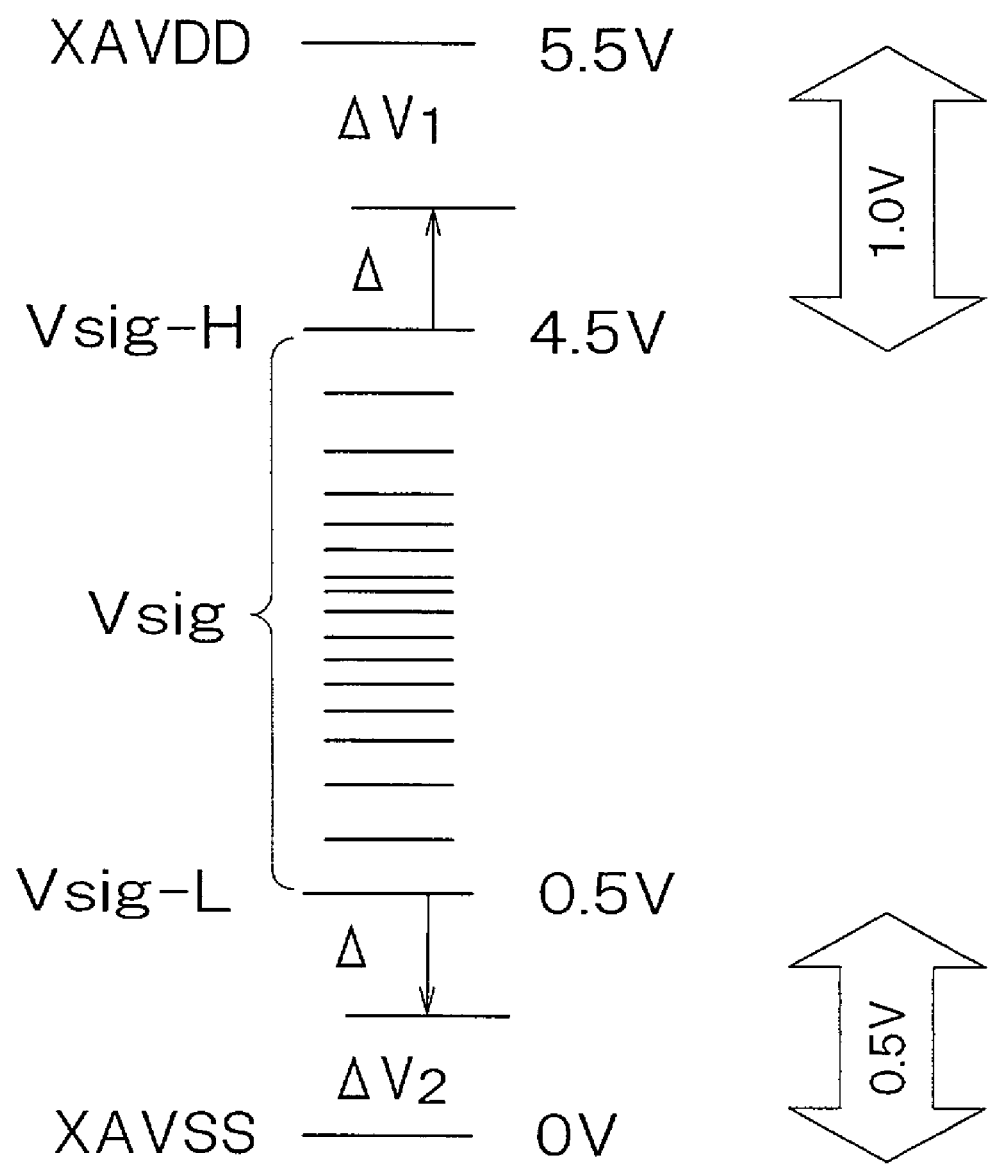
F I G. 22

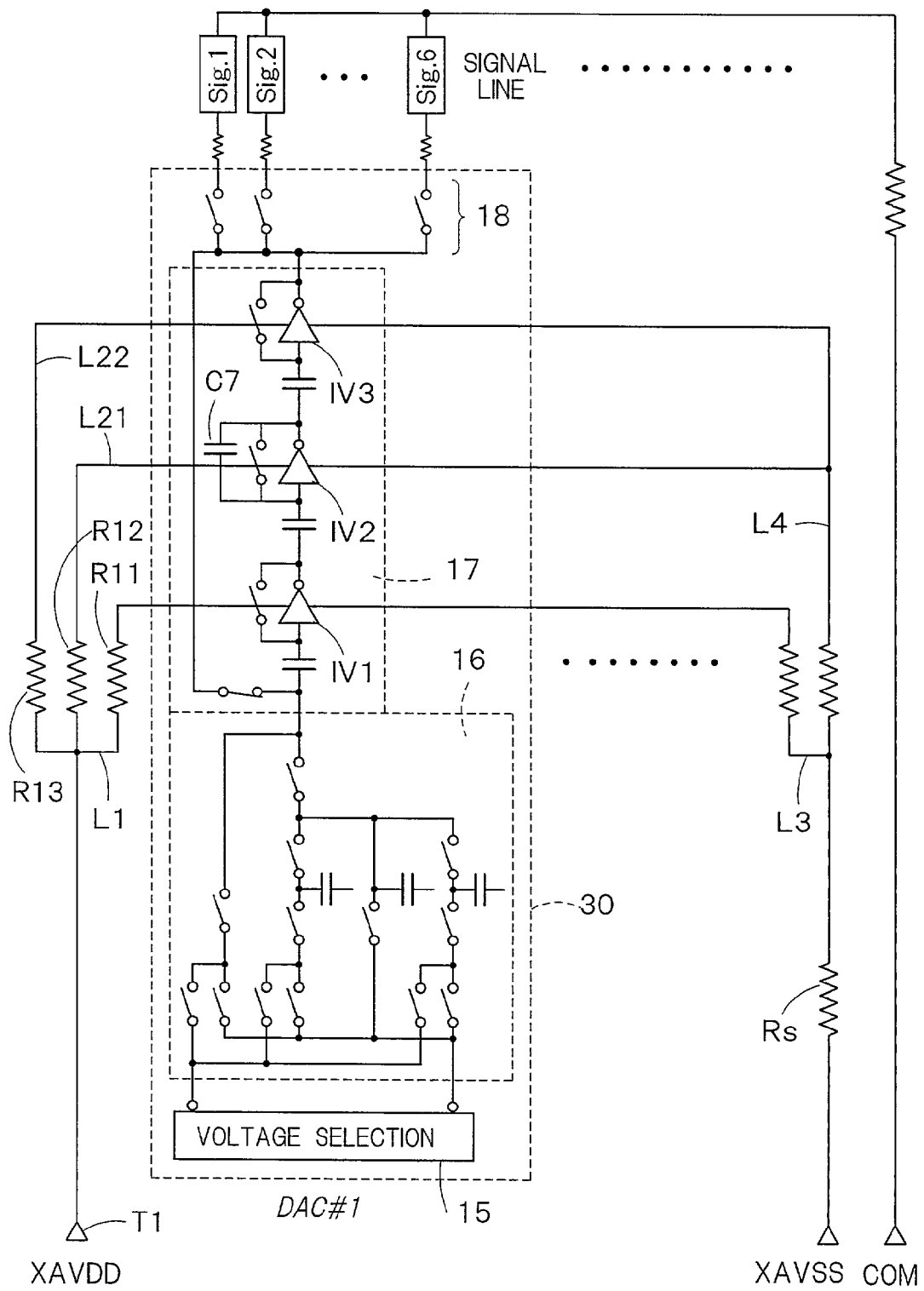
Rd1 = 2kΩ、Rd2 = 200Ω、Rd3 = 700Ω
F I G. 23

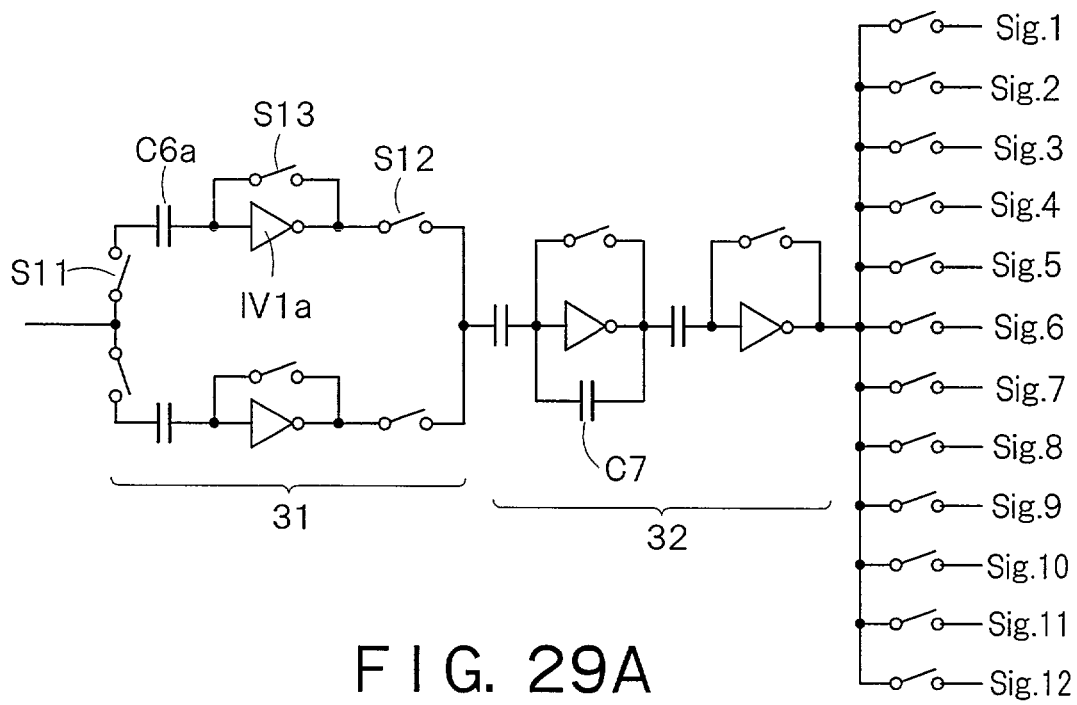
F I G. 29A
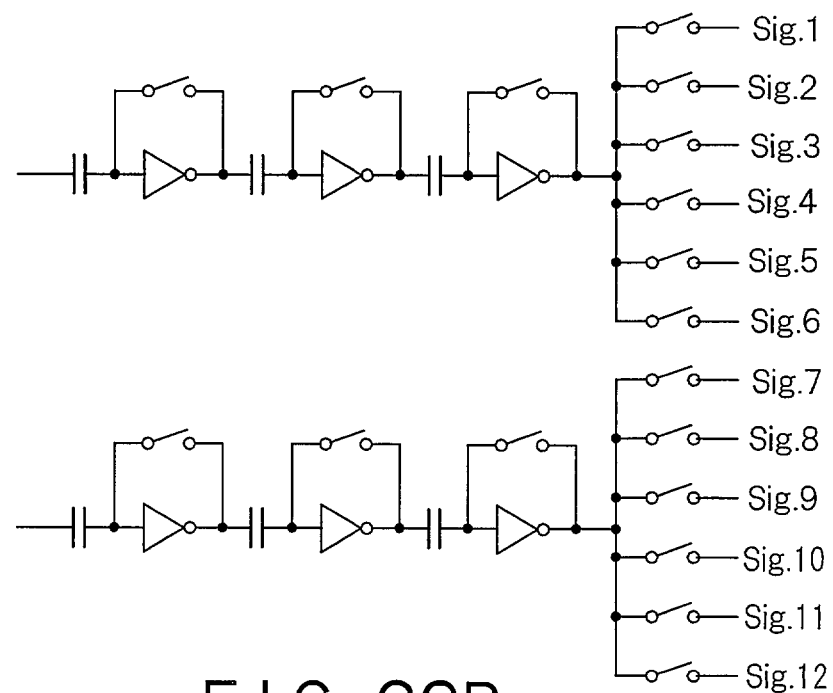
F I G. 29B

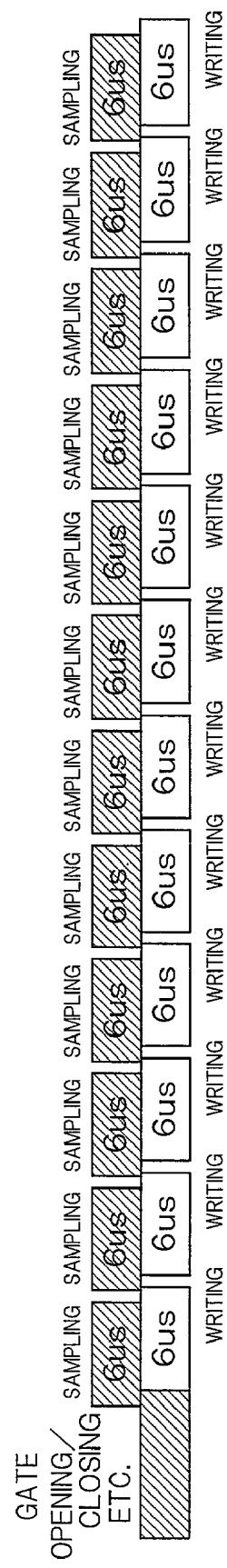
F I G. 30B
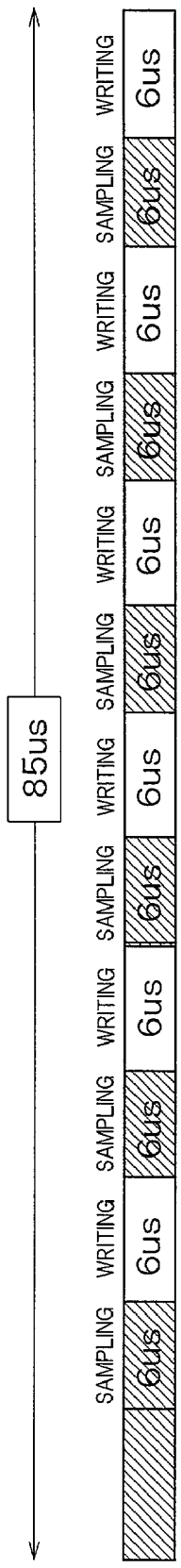
F I G. 30A

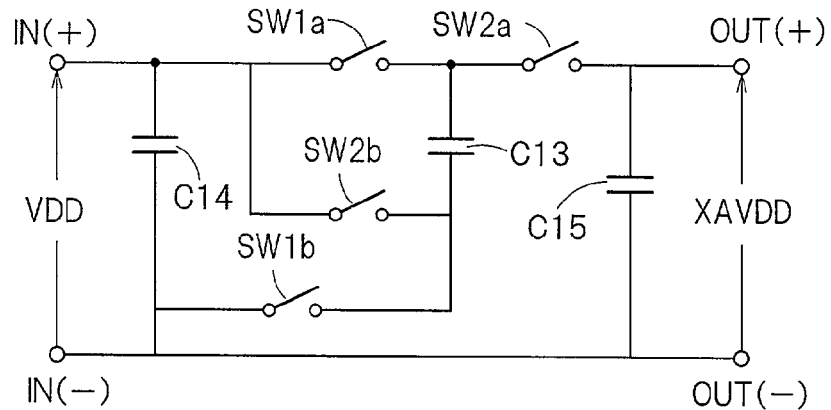
F I G. 33
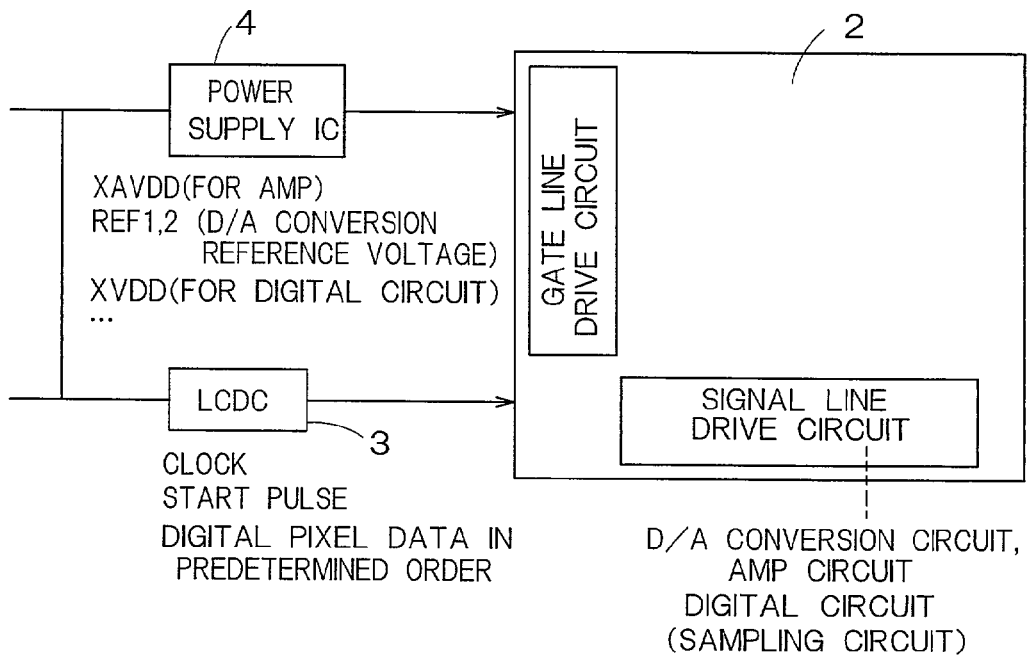
F I G. 34
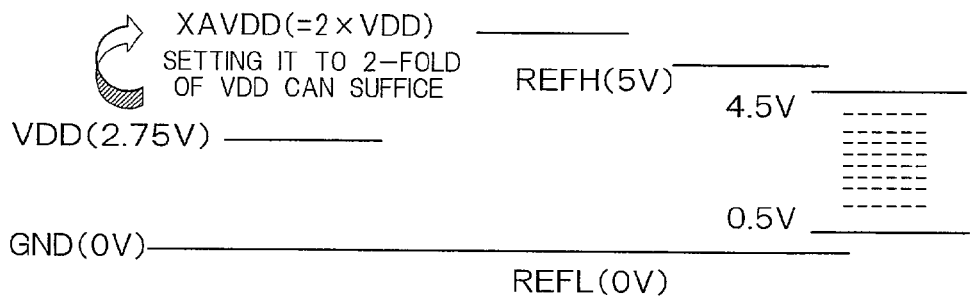
F I G. 35

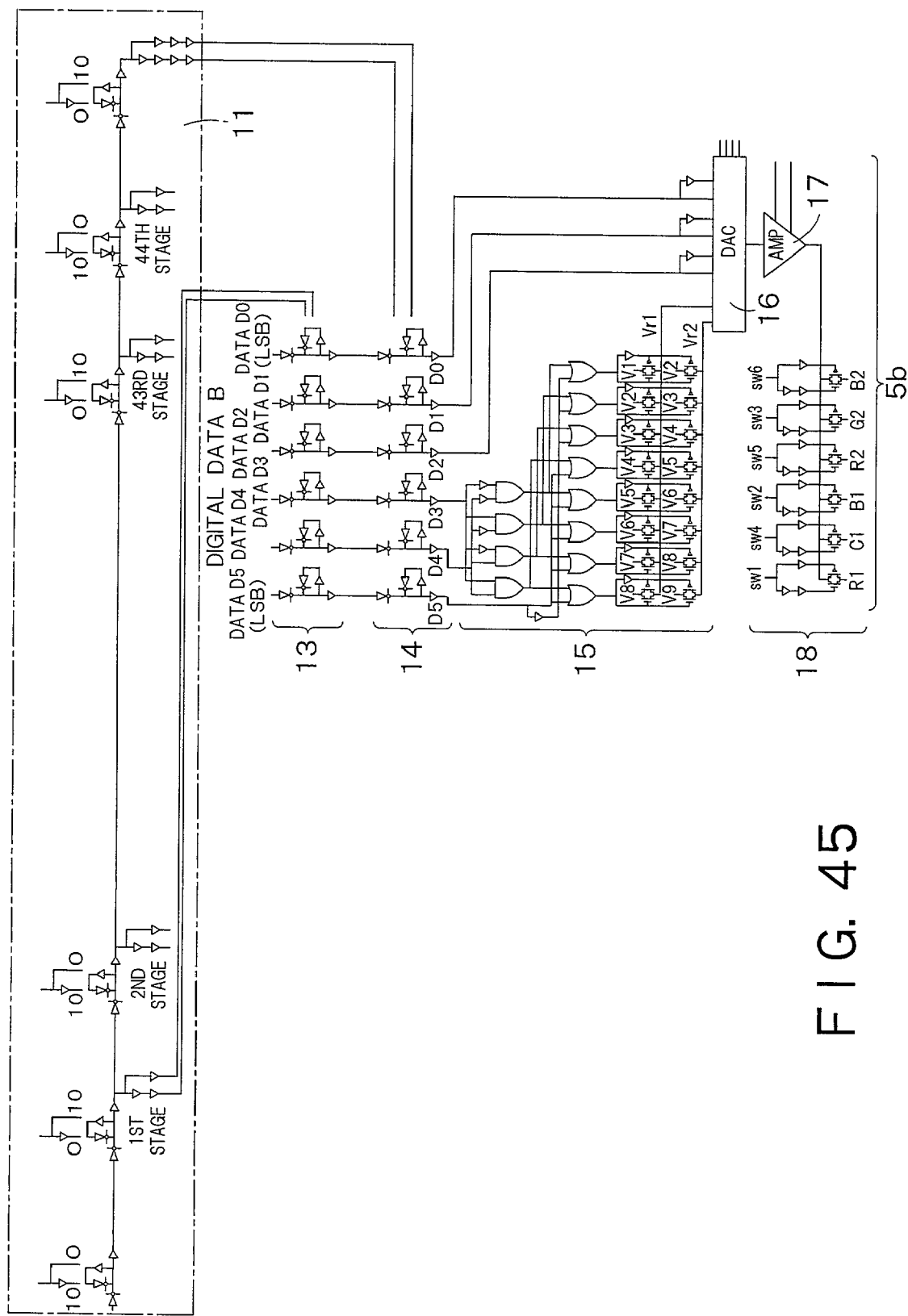
F I G. 45

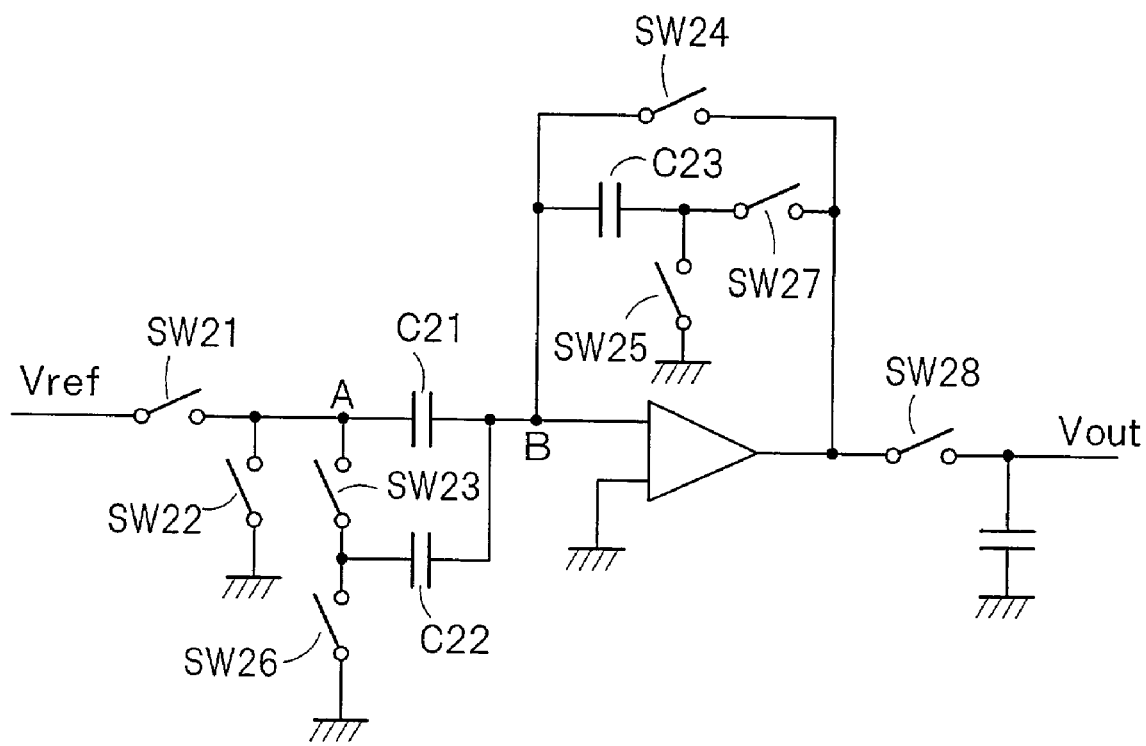
F I G. 47

DISPLAY APPARATUS, DIGITAL-TO-ANALOG CONVERSION CIRCUIT AND DIGITAL-TO-ANALOG CONVERSION METHOD

CROSS REFERENCE TO RELATED APPLICATIONS

This application is based upon and claims the benefit of priority from the prior Japanese Patent Applications No. 2001-132969 filed on Apr. 27, 2001, No. 2001-148175 filed on May 17, 2001 and No. 2001-400089 filed on Dec. 28, 2001, the entire contents of which are incorporated herein by reference.

BACKGROUND OF THE INVENTION

1. Field of the Invention

The present invention relates to a D/A converter which converts digital pixel data into analog video signals, a display apparatus in which an amplifier for amplifying an output from the D/A converter and a signal line selection circuit are formed integrally with a pixel array portion on an insulation substrate, a digital-to-analog conversion circuit for converting a digital signal into an analog signal, and a digital-to-analog conversion method.

2. Related Background Art

A liquid display apparatus having a pixel array portion and a drive circuit formed on the same glass substrate has been developed at a full blast. Forming the pixel array portion and the drive circuit on the same glass substrate can reduce the thickness and size of the entire liquid crystal display apparatus, and the liquid crystal display apparatus can be extensively used as a display unit of a portable device such as a mobile phone or a notebook computer.

In this type of liquid crystal display apparatus in which the drive circuit is integrated, TFTs are formed on the glass substrate by using polysilicon or the like, and both the pixel array portion and the drive circuit are formed by using these TFTs (thin film transistors).

However, since the operation speed of the TFT formed on the glass substrate is not very fast, various kinds of ingenuity of circuits are required in order to constitute the drive circuit. Further, forming the TFT with the uniform characteristics on the glass substrate is technically difficult at the present moment, and deterioration in display quality, e.g., irregularities in display may occur due to a difference in characteristics of the TFTs.

Furthermore, when the pixel array portion and the drive circuit are formed on the same glass substrate, a percentage of the pixel array portion which occupies an area of the glass substrate becomes relatively small, and a frame becomes disadvantageously large.

FIG. 47 is a circuit diagram showing a prior art DAC constituted by using polysilicon TFTs on the glass substrate, which is disclosed in Japanese patent application laid-open No. 340072/1998. The DAC in FIG. 7 turns either a switch SW21 or SW22 in accordance with a value of each bit of a digital signal. As a result, a node A has a reference voltage Vref or a ground voltage. At the beginning, a switch SW 23 is in the off state, and the electric charge stored in a capacitor element C21 is redistributed to a capacitor element C22. This processing is repeated with respect to each bit of the digital signal.

Upon completing this processing, switches SW24 and Sw25 enter the off state, whilst switches SW26 and SW27 enter the on state. As a result, a voltage of a node B is transferred to an output of an amplifier, and an offset voltage stored in a capacitor element C23 in a negative feedback loop is simultaneously withheld.

With this processing, a voltage obtained after D/A conversion is outputted from the amplifier. After termination of the D/A conversion processing, a switch SW28 is turned on, and signal line writing is performed.

Since the DAC in FIG. 47 performs storage and redistribution of the electric charge in accordance with each bit of the digital signal, the D/A conversion takes time, and the signal line write time is shortened. Therefore, the signal line can not possibly satisfactorily rise or fall to a desired voltage, and irregularities in brightness or the like occurs, which leads to degradation in display quality.

Furthermore, the DAC in FIG. 47 and the amplifier provided at the rear stage of the DAC are required for each signal line, and power consumption hence increases and an area occupied by the circuits becomes large, thereby disabling reduction in the frame size.

SUMMARY OF THE INVENTION

It is an object of the present invention to provide a display apparatus capable of improving display quality.

Moreover, it is another object of the present invention to provide a display apparatus capable of reducing the size of a frame.

In addition, it is still another object of the present invention to provide a digital-to-analog conversion circuit capable of reducing a time required for digital-to-analog conversion, a display apparatus and a digital-to-analog conversion method.

Additionally, it is yet another object of the present invention to provide a digital-to-analog conversion circuit which prolongs a period of outputting a result of digital-to-analog conversion by causing a period of performing digital-to-analog conversion processing to partially overlap the period of outputting a result of digital-to-analog conversion, a display apparatus and a digital-to-analog conversion.

A display apparatus according to an embodiment of the present invention comprises:

signal lines and scanning lines which are vertically and horizontally provided in rows on an insulation substrate;

display elements formed in the vicinity of the respective intersections of said signal lines and said scanning lines;

a scanning line drive circuit which drives said scanning lines; and a signal line drive circuit which is formed on said insulation substrate and drives said signal lines, said signal line drive circuit having:

an amplifier which amplifies an analog video signal; and a signal line selection circuit which selects a signal line to which said analog video signal amplified in said amplifier is supplied, said amplifier having:

an odd number of inverters which are cascade-connected;

first capacitor elements each of which is connected between stages of said inverters and between an input terminal of said inverter on a first stage and an output terminal of said inverter on a last stage;

a first power supply line which supplies a power supply voltage to said inverter on said first stage; and a second power supply line which supplies a power supply voltage to said inverters on stages other than said first stage.

A display apparatus according to an embodiment of the present invention comprises:

signal lines and scanning lines which are vertically and horizontally provided in rows on an insulation substrate;

display elements which are formed in the vicinity of the respective intersections of said signal lines and said scanning lines;

a scanning drive circuit which drives said scanning lines; and a signal line drive circuit which is formed on said insulation substrate and drives said signal lines, said signal line drive circuit having:

an amplifier which amplifies an analog video signal; and a signal line selection circuit which selects a signal lines to which said analog video signal amplified by said amplifier is supplied, said signal line selection circuit having a plurality of analog switches connected in parallel in accordance with each signal line, a plurality of said analog switches corresponding to the same signal line being controlled to be turned on/off in the same direction.

A display apparatus according to an embodiment of the present invention comprises:

signal lines and scanning lines which are vertically and horizontally provided in rows on an insulation substrate;

display elements which are formed in the vicinity of the respective intersections of said signal lines and said scanning lines;

analog switches formed on said insulation substrate; and punch-through compensation analog switches which are respectively connected to at least some of said analog switches in series and controlled to be turned on/off in directions opposed to those of said corresponding analog switches, each of said punch-through compensation analog switches having a pMOS transistor and an nMOS transistor connected in parallel, and a source and a drain of each of said both transistors being short-circuited.

A display apparatus according to an embodiment of the present invention comprises:

signal lines and scanning lines vertically and horizontally provided in rows on an insulation substrate;

display elements which are formed in the vicinity of the respective intersections of said signal lines and said scanning lines;

a scanning line drive circuit which drives said scanning lines; and a signal line drive circuit which is formed on said insulation substrate and drives said signal lines, said signal line drive circuit having:

an amplifier which amplifies an analog video signal; and a signal line selection circuit which selects a signal line to which said analog video signal amplified by said amplifier is supplied, said amplifier having:

a power supply line and a ground line;

three inverters which are cascade-connected;

resistance elements provided between said inverters and said power supply line;

resistance elements provided between said inverters and said ground line;

a first capacitor element which is connected between an input terminal of said inverter on a first stage and an output terminal of said inverter on a last stage;

a switching circuit which is provided to said inverter on said first stage and capable of switching whether input and output terminals of said inverter on said first stage are short-circuited; and a phase compensation impedance element which is inserted between input and output terminals of said inverter on a second stage.

A display apparatus according to an embodiment of the present invention comprises:

an insulation substrate having signal lines and scanning lines which are vertically and horizontally provided in rows, display elements which are formed in the vicinity of the respective intersections of said signal lines and said scanning lines, a scanning line drive circuit which drives said scanning lines, a signal line drive circuit which is formed on said insulation substrate and drives said signal lines;

an opposed substrate which is oppositely arranged on said insulation substrate and to which a common electrode is formed, said signal line drive circuit having:

an amplifier which amplifies an analog video signal; and a signal line selection circuit which selects a signal line to which said analog video signal amplified by said amplifier is supplied, said amplifier having an odd number of inverters which are cascade-connected and maximizing a gain of each inverter in the vicinity of a voltage where the inclination of a voltage-brightness characteristic curve of said display elements becomes maximum.

A display apparatus according to an embodiment of the present invention comprises:

signal lines and scanning lines which are vertically and horizontally provided in rows on an insulation substrate;

display elements which are formed in the vicinity of the respective intersections of said signal lines and said scanning lines;

a scanning line drive circuit which drives said scanning lines; and a signal line drive circuit which is formed on said insulation substrate and drives said signal lines, said signal line drive circuit having:

an amplifier which amplifies an analog video signal; and a signal line selection circuit which selects a signal line to which said analog video signal amplified by said amplifier is supplied, said amplifier having inverters on (2n+1) stages (where n is an integer not less than 1) which are cascade-connected, and capacitor elements respectively connected between said (2n+1) stages of said inverters and between an input terminal of said inverter on a first stage and an output terminal of said inverter on a last stage, a size of each transistor constituting said inverters from a second stage to a 2n-th stage being equal to or larger than a size of a transistor constituting said inverter on a last stage, and a size of each transistor constituting said inverter on a first stage being equal to or smaller than a size of a transistor constituting said inverter on said second stage.

A display apparatus according to an embodiment of the present invention comprises:

signal lines and scanning lines which are vertically and horizontally provided in rows on an insulation substrate;

display elements which are formed in the vicinity of the respective intersections of said signal lines and said scanning lines;

a scanning line drive circuit which drives said scanning lines; and a signal line drive circuit which is formed on said insulation substrate and drives said signal lines,
said signal line drive circuit having:
an amplifier which amplifies an analog video signal; and
a signal line selection circuit which selects a signal line to which said analog video signal amplified by said amplifier is supplied,
said amplifier having:
a power supply line and a ground line;
inverters on (2n+1) stages (where n is an integer not less than 1) which are cascade-connected;
capacitor elements which are respectively connected between said (2n+1) stages of said inverters and between an input terminal of said inverter on a first stage and an output terminal of said inverter on a last stage; and
a plurality of impedance elements respectively connected to said power supply line and said odd number of inverters,
an impedance value of said impedance elements respectively connected to said inverters from a second stage to a 2n-th stage being not more than an impedance value of said impedance element connected to said inverter on a last stage, and an impedance value of said impedance element connected to said inverter on a first stage being not less than an impedance value of said impedance element connected to said inverter on said second stage.

A display apparatus according to an embodiment of the present invention comprises:
signal lines and scanning lines which are vertically and horizontally provided in rows on an insulation substrate;
display elements which are formed in the vicinity of the respective intersections of said signal line and said scanning line;
a scanning line drive circuit which drives said scanning lines; and
a signal line drive circuit which is formed on said insulation substrate and drives said signal lines,
said signal line drive circuit having:
a latch circuit which latches digital pixel data;
a D/A converter which converts a latch output from said latch circuit into an analog video signal;
an amplifier which amplifies said analog video signal converted by said D/A converter; and
a signal line selection circuit which selects a signal line to which said analog video signal amplified by said amplifier is supplied,
said amplifier having:
inverters on (2n+1) stages (where n is an integer not less than 1) which are cascade-connected; and
capacitor elements respectively connected between said (2n+1) stages of said inverters and between an input terminal of said inverter on a first stage and an output terminal of said inverter on a last stage,
each of said inverters on said (2n+1) stages having first and second power supply terminals,
a reference voltage which differs in accordance with each of said inverters on said (2n+1) stages being supplied to at least one of said first and second power supply terminals, a reference voltage which is supplied to at least one of said first and second power supply terminals of each of said inverters from said second stage to said 2n-th stage being not less than a reference voltage supplied to at least one of said first and second power supply terminals of said inverter on said last stage, and a reference voltage supplied to at least one of said first and second power supply terminals of said inverter on said first stage being not more than a reference voltage supplied to at least one of said first and second power supply terminals of said inverter on said second stage.

A display apparatus according to an embodiment of the present invention comprises:
signal lines and scanning lines which are vertically and horizontally provided in rows on an insulation substrate;
display elements which is formed in the vicinity of the respective intersections of said signal lines and said scanning lines;
a scanning line drive circuit which drives said scanning lines; and
a signal line drive circuit which is formed on said insulation substrate and drives said signal lines,
said signal line drive circuit having:
an amplifier which amplifies an analog video signal; and
a signal line selection circuit which selects a signal line to which said analog video signal amplified by said amplifier is supplied, and performs signal line writing,
said amplifier having:
a plurality of first amplification portions each of which is constituted by one or more inverters, and which are connected to each other in parallel;
a second amplification portion consisting of a plurality of inverters which are cascade-connected;
a selection portion which sequentially selects any one of a plurality of said first amplification portions, supplies an output of a selected first amplification portion to an inverter on a first stage of said second amplification portion, and feeds back an output of said second amplification portion to an input side of an inverter on a first stage of said selected first amplification portion in order to form a closed loop; and
a plurality of capacitor elements which are respectively connected between stages of respective inverters in said closed loop,
said amplifier amplifying an analog video signal corresponding to a next signal line to which writing is performed while said signal line selection circuit is performing signal line writing.

A display apparatus according to an embodiment of the present invention comprises:
signal lines and scanning lines which are vertically and horizontally provided in rows on an insulation substrate;
display elements which are formed in the vicinity of the respective intersections of said signal lines and said scanning lines;
a scanning line drive circuit which drives said scanning lines;
a signal line drive circuit which is formed on said insulation substrate and drives said signal lines; and
a power supply voltage generation circuit which generates a second power supply voltage having a voltage level which is a substantially integral multiple of a first power supply voltage supplied from the outside based on said first power supply voltage,
said signal line drive circuit having:
an amplifier which amplifies an analog video signal; and
a signal line selection circuit which selects a signal line to which said analog video signal amplified by said amplifier is supplied, and performs signal line writing,
said amplifier being driven with said second power supply voltage.

A digital-to-analog conversion circuit which outputs a voltage corresponding to a digital signal consisting of n (n is an integer not less than 2) bits based on a first reference voltage and a second reference voltage whose voltage level is lower than that of said first reference voltage, comprising:
a first capacitor element capable of storing an electric charge according to a value of each bit other than a most significant bit in said digital signal;

a second capacitor element capable of redistributing a stored electric charge between itself and said first capacitor element;

a third capacitor element capable of storing an electric charge according to a value of a most significant bit in said digital signal; and an electric charge control circuit which repeatedly performs in accordance with each bit other than a most significant bit in said digital signal, processing of sequentially storing an electric charge according to a value of each bit other than a most significant bit in said digital signal into said first capacitor element and redistributing a stored electric charge between said first capacitor element and said second capacitor element, stores an electric charge according to a value of a most significant bit in said digital signal into said third capacitor element, and then carries out redistribution of a stored electric charge between said second capacitor element and said third capacitor element.

A display apparatus comprising:

a plurality of switching elements which are respectively provided in the vicinity of the respective intersections of a signal lines and a scanning lines;

a signal line drive circuit which drives signal lines; and a scanning line drive circuit which drives scanning lines, said signal line drive circuit having said digital-to-analog conversion circuit defined in claim 22 which converts a digital signal indicative of pixel information into an analog signal, an output from said digital-to-analog conversion circuit being supplied to a corresponding signal line.

BRIEF DESCRIPTION OF THE DRAWINGS

FIG. 1 is a block diagram showing a schematic structure of a first embodiment of a liquid crystal display apparatus;

FIG. 5 is a view showing an example of dividing types of power supply voltages supplied from the outside based on an inverter on a first stage and inverters on second and subsequent stages;

FIG. 10 is a circuit diagram showing an example in which a capacitor element for phase compensation is provided in the AMP;

FIG. 11 is a circuit diagram showing a modification of FIG. 10;

FIG. 12 is a circuit diagram showing another modification of FIG. 10;

FIG. 13 is a circuit diagram showing a modification of FIG. 12;

FIG. 22 is a view showing margins on a power supply voltage side and a ground voltage side;

FIG. 23 is a circuit diagram showing an 11th embodiment of the signal line drive circuit;

FIG. 29A is a circuit diagram of the AMP in the signal line drive circuit according to a 16th embodiment, and FIG. 29B is a circuit diagram showing a prior art AMP;

FIG. 30A is an operation timing chart of the AMP 17 according to the embodiment, and FIG. 30B is an operation timing chart of the AMP 17 in FIG. 25 illustrated for the purpose of comparison;

FIG. 33 is a circuit diagram showing an example of a booster circuit included in the power supply IC depicted in FIG. 2;

FIG. 34 is a view for illustrating the function of the power supply IC;

FIG. 35 is a view showing the relationship between voltage levels of an external power supply voltage VDD, a power supply voltage XAVDD, a reference voltage maximum value REFH and a reference voltage minimum value REVL generated by a voltage division resistance ladder;

FIG. 45 is a circuit diagram of the signal line drive circuit showing an example of H common inversion drive;

FIG. 47 is a circuit diagram of a prior art DAC constituted by using polysilicon TFTs on a glass substrate.

DESCRIPTION OF THE PREFERRED EMBODIMENTS

Figure 2:
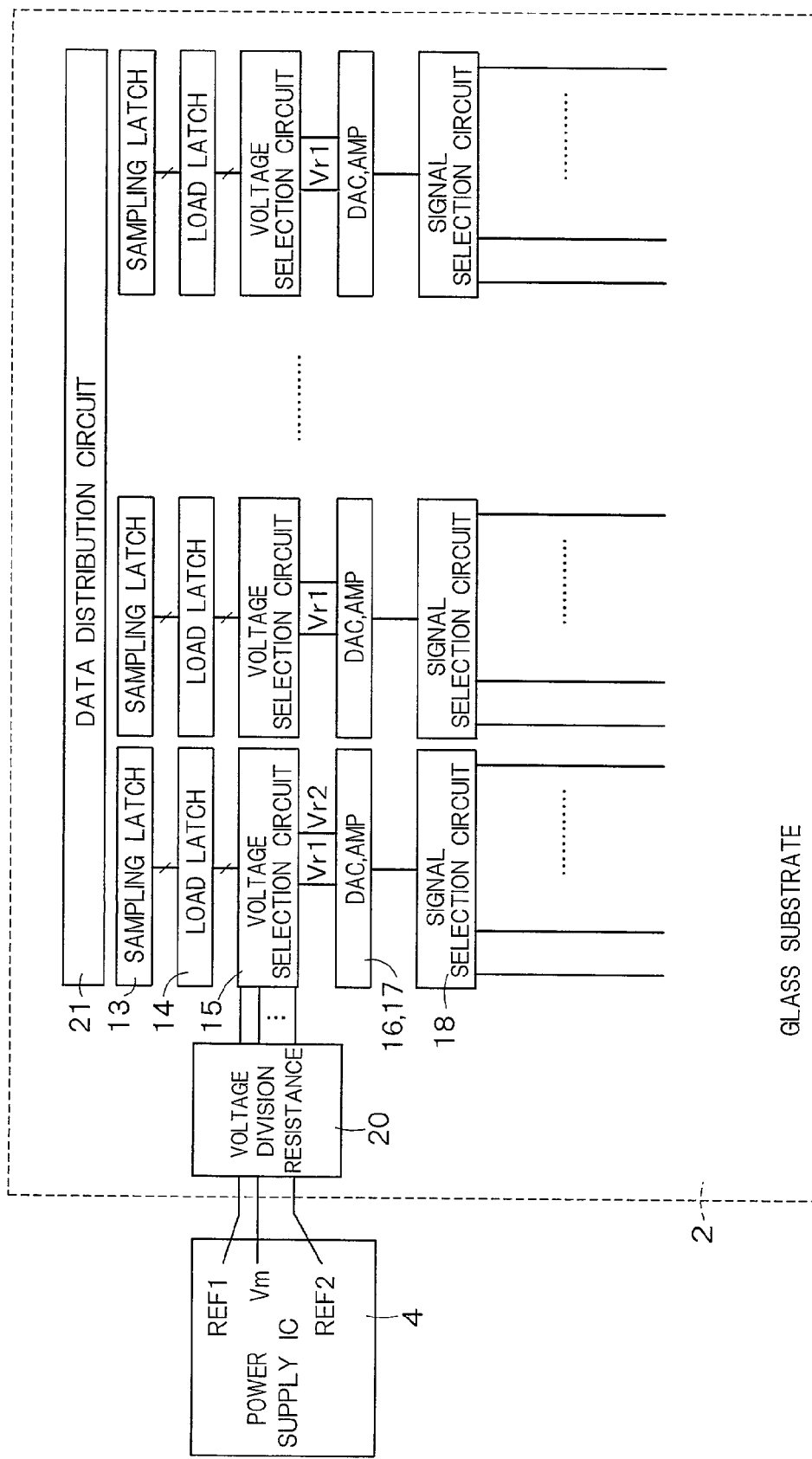
FIG. 2 is a block diagram showing an internal structure of a signal line drive circuit.

Concrete description will now be given as to a digital-to-analog conversion circuit, a display apparatus and a digital-to-analog conversion method according to the present invention with reference to the accompanying drawings.

FIG. 1 is a block diagram showing a schematic structure of a first embodiment of a display apparatus according to the present invention and illustrates a block structure of a liquid crystal display apparatus. The liquid crystal display apparatus depicted in FIG. 1 includes a glass substrate 2 in which a pixel array portion 1 and drive circuits are integrally formed. The glass substrate 2 is arranged so as to be opposed to a non-illustrated opposed substrate and sealed with a liquid crystal layer therebetween.

As separate from the glass substrate 2 illustrated in FIG. 1, there is provided a substrate having mounted thereon a controller IC3 which transmits a digital video signal and a control signal to the drive circuit and a power supply IC4 which supplies a power supply voltage, and these substrates are connected to each other through a flexible printed board or the like.

On the glass substrate 2 in FIG. 1 are provided the pixel array portion 1 in which signal lines and scanning lines are arranged and pixel TFTs are formed in the vicinity of each intersection of the signal line and the scanning line, a signal line drive circuit 5 which drives the signal lines, and a scanning line drive circuit 6 which drives the scanning lines.

The signal line drive circuit 5 includes: a shift register 11 which generates a shift pulse obtained by sequentially shifting a start pulse; a data bus 12 which supplies digital pixel data; a sampling lath 13 which sequentially latches the digital pixel data in synchronization with the shift pulse; a load latch 14 which collectively latches latch outputs from the sampling latch 13 with the same timing; a voltage selection circuit 15 which selects a reference voltage based on an upper bit string of the digital pixel data; a D/A converter (which will be referred to as a DAC hereinafter) 16 which D/A-converts a lower bit string of the digital pixel data based on the selected reference voltage; an amplifier (which will be referred to as an AMP hereinafter) 17 which amplifies a D/A-converted analog video signal; a signal line selection circuit 18 which controls to switch a signal line to which an output from the AMP 17 is to be supplied; and a timing control circuit 19.

FIG. 2 is a block diagram showing an internal structure of the signal line drive circuit 5. A data distribution circuit 21 in FIG. 2 corresponds to the shift register 11 and the data bus 12 in FIG. 1. Further, in FIG. 2, the DAC 16 and the AMP 17 are collectively represented by one block.

A voltage division resistance ladder 20 generates nine types of reference voltages V1 to V9 based on three types of reference voltages REF1, Vm and REF2 supplied from the power supply IC4, and supplies the generated reference voltages V1 to V9 to the voltage selection circuit 15. The voltage selection circuit 15 selects and outputs two types of reference voltages Vr1 and Vr2 from the reference voltages V1 to V9 based on upper three bits in the digital pixel data.

The DAC 16 generates a voltage corresponding to lower three bits in the digital pixel data by using the reference voltages Vr1 and Vr2 outputted from the voltage selection circuit 15. The voltage generated by the DAC 16 is amplified by the AMP 17 and then supplied to the signal line selection circuit 18.

Figure 8:
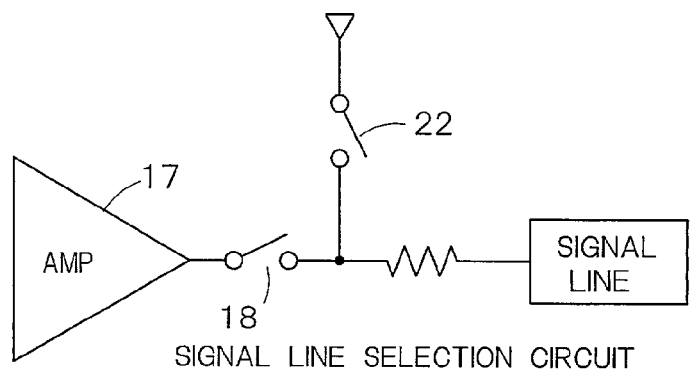
FIG. 8 is a circuit diagram showing a structure of a pre-charge control circuit.

The signal line selection circuit 18 pre-charges the corresponding signal line before supplying the voltage from the AMP 17 to that signal line. As the pre-charge voltage, the reference voltage Vm supplied from the power supply IC4 is used. More specifically, pre-charging is carried out by using a circuit having such a structure as shown in FIG. 8.

Figure 3:
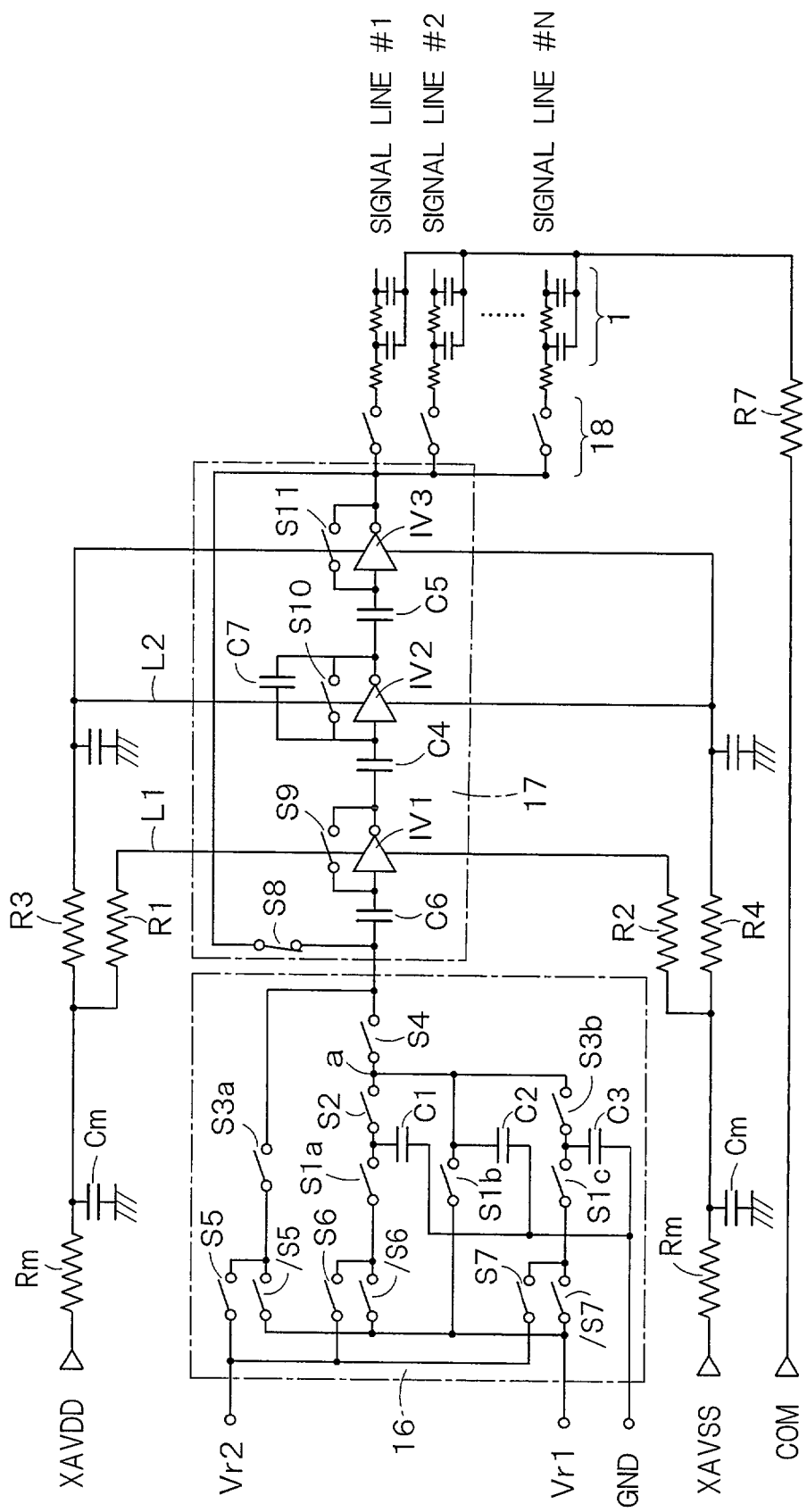
FIG. 3 is a circuit diagram showing a detailed structure of a DAC, an AMP 17 and a signal line selection circuit 18 in the signal line drive circuit.

FIG. 3 is a circuit diagram showing a detailed structure of the DAC 16, the AMP 17 and the signal line selection circuit 18 in the signal line drive circuit 5. As illustrated in the drawing, the DAC 16 executes D/A conversion based on the reference voltages Vr1 and Vr2 supplied from the voltage selection circuit 15.

The DAC 16 has capacitor elements C1 to C3, analog switches S1a to S1c, S2, S3a, S3b and S4 which redistribute the electric charge of the capacitor elements C1 to C3, and analog switches S5, /S5, S6, /S6, S7 and /S7 which are controlled to be turned on/off in accordance with the logic of lower three bits in the digital pixel data. Besides, a capacitor element C6 shared by the DAC 16 and the AMP 17 is also provided. This capacitor element C6 is used in the process of the D/A conversion operation and in the operation control over the first-stage inverter of the AMP 17.

Figure 4:
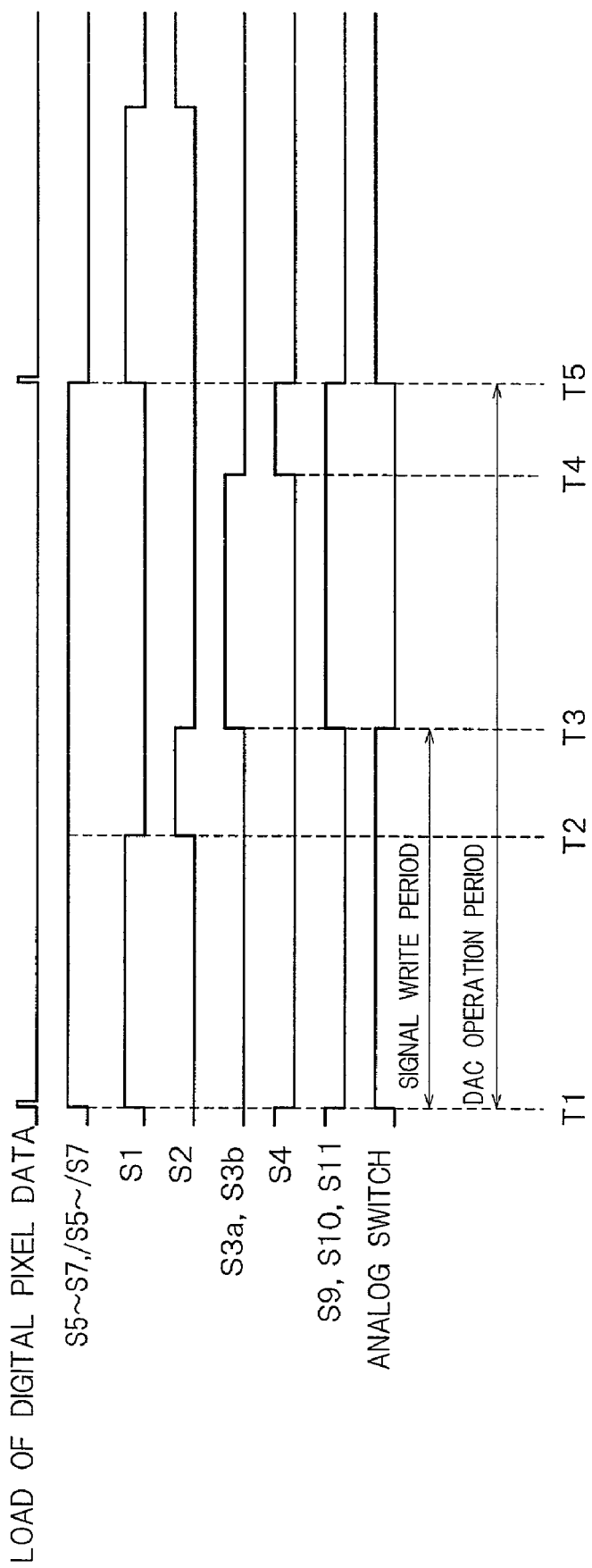
FIG. 4 is an operation timing chart of the DAC.

FIG. 4 is an operation timing chart of the DAC 16. At a time T1, the analog switches S5 to S7 are first tuned on/off in accordance with lower three bits in the digital pixel data, and the analog switches S1a to S1c are turned on. As a result, the electric charge according to lower two bits in the digital pixel data is stored in the capacitor elements C1 and C3. For example, when the analog switch S6 is in the on state, the electric charge according to the voltage Vr2 is stored in the capacitor C1. When the analog switch /S6 is in the on state, the electric charge according to the voltage Vr1 is stored in the capacitor element C1. Further, when the analog switch S7 is in the on state, the electric charge according to the voltage Vr2 is stored in the capacitor element C3. When the analog switch /S7 is in the on state, the electric charge according to the voltage Vr1 is stored in the capacitor element C3. On the other hand, the electric charge according the voltage Vr1 is constantly stored in the capacitor C2.

Then, at a time T2, the analog switch S2 is turned on, and the electric charge is redistributed between the capacitor elements C1 and C2. Thereafter, at a time T3, the analog switches S3a and S3b are turned on, the electric charge is redistributed between the capacitor elements C2 and C3, and the electric charge according to a third bit is stored in the capacitor element C6. Subsequently, at a time T4, the analog switch S4 is turned on, and the electric charge stored in each of the capacitor elements C2 and C6 is redistributed. In this manner, D/A conversion based on the lower three bits is completed, and a desired analog voltage Vout is stored at the left end of the capacitor element C6. Furthermore, after the time T3, all the analog switches 18 between the AMP 17 and the signal line are turned off, and the analog switches S9, S10 and S11 are turned on, thereby short-circuiting inputs/outputs of IV1 to IV3. Operation threshold voltages of IV1 to IV3 are accumulated at the right ends of the capacitors C4 to C6. At a time T5, the analog switches S9 to S11 are turned off, one of the switch S8 and the switch 18 is turned on, and the write operation is performed so as to equalize the signal line voltage to an analog voltage Vout. The AMP 17 writes to the signal lines voltages which equalize the voltage at the left of the capacitor C6 to said analog voltage.

Then, after the time T5, the operation similar to that at the times T1 to T4 is repeated.

As shown in FIG. 3, the AMP 17 has: three inverters IV1, IV2 and IV3 which are cascade-connected; capacitor elements C4 and C5 inserted between stages of the inverters IV1 to IV3; an analog switch S8 and a capacitor element C6 connected between the inverter IV3 on the last stage and the inverter IV1 on the first stage in series; and analog switches S9 to S11 inserted between input/output terminals of each of the inverters IV1 to IV3.

Although a power supply voltage XAVDD and a ground voltage XAVSS are respectively supplied to the inverters IV1 to IV3 on the three stages in the AMP 17, a power supply line L1 of the inverter IV1 on the first stage is separated from a power supply line L2 of the inverters IV2 and IV3 on the second and subsequent stages in this embodiment as shown in FIG. 3. Specifically, the power supply voltage XAVDD and the ground voltage XAVSS are respectively supplied to the inverter IV1 on the first stage through resistance elements R1 and R2, whereas the power supply voltage XAVDD and the ground voltage XAVSS are respectively supplied to the inverters IV2 and IV3 on the second and subsequent stages through resistances R3 and R4.

The power supply line of only the inverter IV1 on the first stage is separated in this manner because the inverter IV1 on the first stage has a great impact on the accuracy of the AMP 17.

It is to be noted that the concrete circuit configuration of separating the power supply line of only the inverter IV1 on the first stage is not restricted to that illustrated in FIG. 3. For example, FIG. 5 shows an example of dividing types of the power supply voltages supplied from the outside depending on the inverter IV2 on the first stage and the inverters IV2 and IV3 on the second and subsequent stages. In case of FIG. 5, the power supply voltage XAVDD2 is supplied to the inverter IV1 on the first stage through the resistance R1, and the ground voltage XAVSS1 is likewise supplied to the same through the resistance R2. On the other hand, to the inverters IV2 and IV3 on the second and following stages are supplied the power supply voltage XAVDD1 through the resistance R3 and the ground voltage XAVSS1 through the resistance R4.

The capacitor element C7 connected to the input/output ends of the inverter IV2 on the second stage in the AMP 17 is one conformation of an important impedance element found as means for stabilizing the operation of the AMP by the inventor as a result of trial and error. This capacitor element C7 is an impedance element for phase compensation, which will be described later. Even if the capacitor element is not explicitly provided, the capacitor is non-explicitly formed as a parasitic capacitor. There can be considered the case that providing no explicit phase compensation capacitance can suffice, but the inverters on the odd number of stages are cascade-connected in the form of a loop if a value of C7 is set to 0, which results in the circuit that is apt to cause oscillation. This is no use as the amplifier circuit of display apparatus.

In case of FIG. 5, as similar to FIG. 3, since the power supply line of the inverter IV1 on the first stage in the AMP 17 is separated from the power supply line of other inverters IV2 and IV3, the accuracy of the AMP 17 can be improved.

Incidentally, in FIG. 5, analog switches between input/output terminals of each of the inverters IV1 to IV3 in the AMP 17 are omitted for simplicity.

Moreover, a resistance element Rm and a capacitor element Cm shown in FIG. 3 are provided on a module (packaging board), and R1 to R4 are provided on the insulation substrate.

The capacitor element Cm stabilizes the power supply voltages XAVDD and XAVSS, and the resistance elements Rm and R1 to R4 prevent the large current from flowing to the inverters IV1, IV2 and IV3 constituting the AMP 17 and suppress increase in power consumption. In addition, they prevent oscillation of the AMP 17 and suppress generation of a display defect.

(Second Embodiment)

The signal line selection circuit 18 in the signal line drive circuit 5 is constituted by an analog switch consisting of a TFT. However, the ON resistance of the analog switches varies due to irregularities in characteristic of the TFT, and irregularities in drive speed of the signal line by the AMP may lead to display irregularities.

Additionally, if local irregularities in Vth occur, the ON resistance of a specific analog switch becomes too small, the loop of the cascade-connected inverters on the odd number of stages gets close to the no-load state, and oscillation of the AMP is caused. As a result, a line defect may be possibly generated.

Figure 6A:
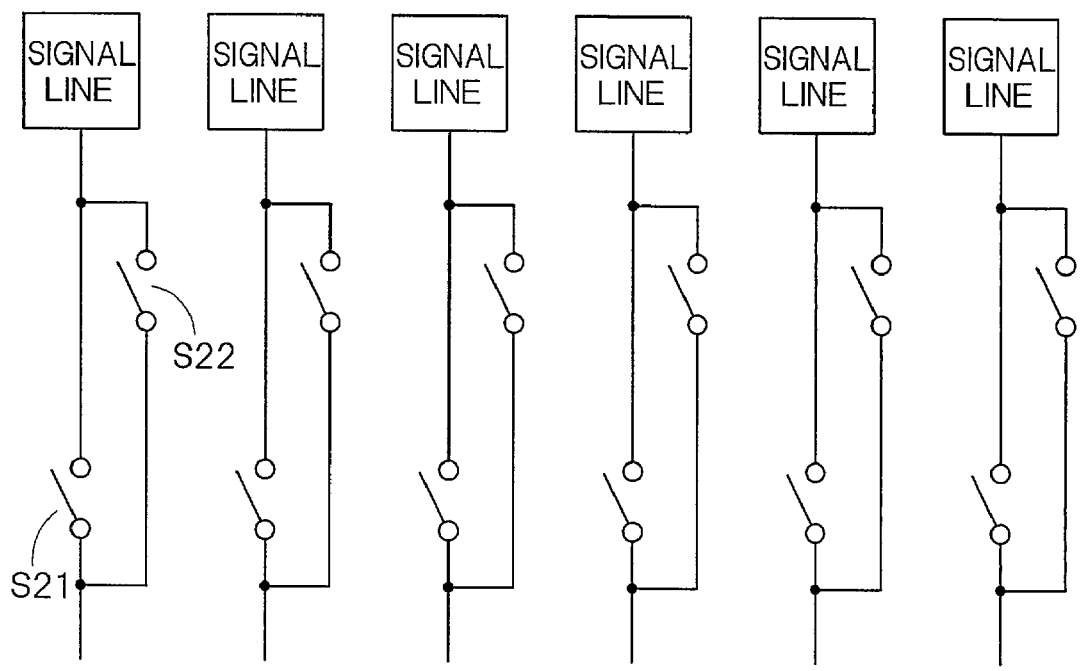
FIGS. 6A–6B are circuit diagrams showing a concrete structure of the signal line selection circuit 18.
Figure 6B:
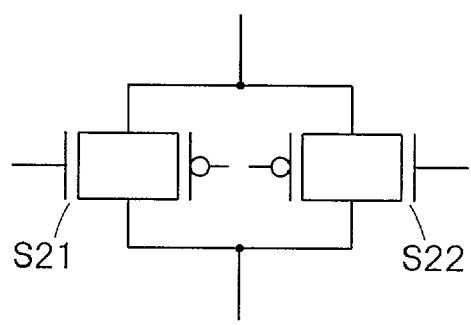

Thus, as shown in FIG. 6A, the signal line selection circuit 18 may be constituted by connecting two analog switches S21 and S22 in parallel in accordance with each signal line. In this case, in regard to the circuit diagram of the signal line selection circuit 18 connected to a given signal line, the analog switches S21 and S22 consisting of a pMOS transistor and an nMOS transistor are connected in parallel as shown in FIG. 6B.

In this manner, by constituting the signal line selection circuit 18 by connecting the analog switches S21 and S22 in parallel, signal line writing is carried out when one of the two analog switches S21 and S22 connected in parallel is turned on even though the other switch can not enter the on state due to local irregularities in Vth. Therefore, the probability of generation of the above-described display defect can be reduced. Accordingly, irregularities in characteristic of the analog switch hardly have an impact. Further, even if one analog switch can not normally function because of a failure, signal line writing can be conducted by using the other analog switch, thereby improving the yield in manufacture.

Incidentally, if there is no restriction in layout, the further effect can be provided by connecting three or more analog switches in parallel.

(Third Embodiment)

Figure 7:
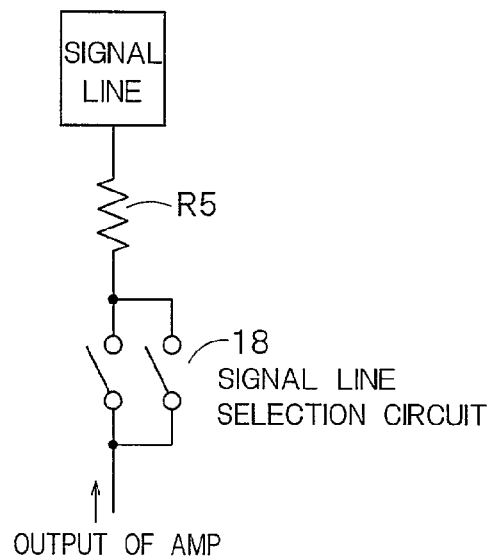
FIG. 7 is a circuit diagram showing a modification of the signal line selection circuit 18.

It is technically difficult to uniformize the ON resistances of the analog switches constituting the signal line selection circuit 18. Thus, as shown in FIG. 7, there can be considered a technique that a resistance element R5 is inserted between the signal line selection circuit 18 and the signal line in order to reduce the influence of the ON resistances of the analog switches in the signal line selection circuit 18. In this case, it is desirable that a resistance value of the resistance element R5 is set to a value larger than ON resistances of the analog switches in the signal line selection circuit 18. As a result, the impedance when seeing the signal line side from the AMP 17 side becomes dependent on the resistance value of the resistance element and unconcerned with the ON resistances of the analog switches in the signal line selection circuit 18, thereby reducing irregularities in signal line write timing.

Furthermore, a pre-charge control circuit 22 may be connected to one end of the resistance element R5 as shown in FIG. 8. An analog switch in the pre-charge control circuit 22 in FIG. 8 turns on before performing signal line writing based on an output from the AMP 17 and carries out pre-charging (preliminary writing) of the signal line. In this manner, the time required for signal line writing can be shortened by pre-charging the signal line.

It is to be noted that a leak current from a pre-charge power supply can be reduced by setting the size of the analog switch in the pre-charge control circuit 22 smaller than that of the analog switch in the signal line selection circuit 18.

On the contrary, the time required for signal line writing can be further reduced by setting the size of the analog switch in the pre-charge control circuit 22 larger than that of the analog switch in the signal line selection circuit 18.

(Fourth Embodiment)

Figure 9A:
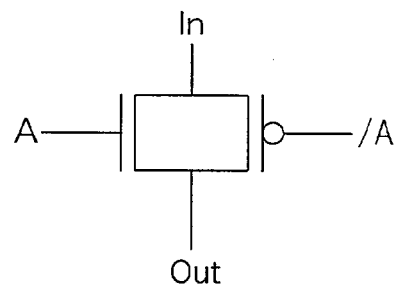
FIGS. 9A–9B are circuit diagrams showing an example in which an analog switch for punch-through compensation is connected to an analog switch in series.

As shown in FIG. 9A, the analog switch used in each portion in the signal line drive circuit 5 usually has a structure in which the nMOS transistor and the pMOS transistor are connected to each other in parallel. In case of this structure, however, when the analog switch enters the off state from the on state, the electric charge stored in the capacitance between the gate and the source of the analog switch flows into the load capacitance, and an output voltage of the analog switch disadvantageously fluctuates.

Here, assuming that respective gate-source capacitances of the pMOS transistor and the nMOS transistor when the analog switch is in the on state are Cgsp(ON) and Cgsn(ON) and respective gate-source capacitances of the pMOS transistor and the nMOS transistor when the analog switch is in the off state are Cgsp(OFF) and Cgsn(OFF), a quantity of fluctuation of the output voltage of the analog switch can be represented by the following expression (1)

$$\Delta V = \frac{\{C_{gsp(ON)} - C_{gsn(OFF)}\}V_a - \{C_{gsn(ON)} - C_{gsp(OFF)}\}(V_a - V_{dd})}{C + C_{gsn(OFF)} + C_{gsp(OFF)}} \quad (1)$$

$$= \frac{\{C_{gsp}(-V_a) - C_{gsn}(-V_a)\}V_a - \{C_{gsn}(V_{dd} - V_a) - C_{gsp}(V_{dd} - V_a)\}(V_a - V_{dd})}{C + C_{gsn}(-V_a) + C_{gsp}(V_{dd} - V_a)}$$

For example, when the output voltage of the analog switch in the signal line selection circuit 18 fluctuates, the write voltage of the signal line fluctuate, which adversely affects the display quality. This is also effective to the switch connected to the capacitance of, e.g., the capacitor elements C1 to C3 of the DAC 16 shown in FIG. 3.

Figure 9B:
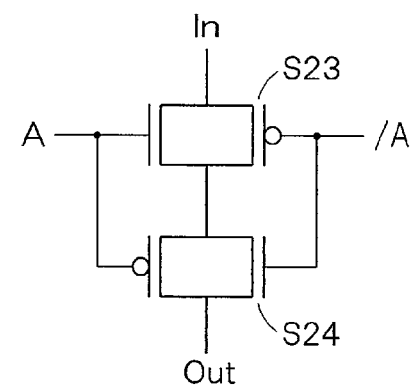

Thus, in this embodiment, in regard to at least some of the analog switches in the signal line drive circuit 5, an analog switch for punch-through compensation S24 is connected to the original analog switch S23 in series as shown in FIG. 9B. This analog switch for punch-through compensation S24 has a structure that the pMOS transistor and the nMOS transistor are connected to each other in parallel and the source-drain terminals of the both transistors are short-circuited. The analog switch for punch-through compensation S24 is on/off controlled in the direction opposite to that of the original analog switch S23.

By providing such an analog switch for punch-through compensation S24 as shown in FIG. 9B, the electric charge stored in the gate-source capacitance of the transistor in the original switch S23 is transferred to the analog switch for punch-through compensation S24 when the original analog switch S23 enters the off state from the on state. Therefore, even if the original analog switch S23 is turned on/off, the fluctuation in an output voltage of that switch S23 becomes small that it does not have an impact on display.

(Fifth Embodiment)

A fifth embodiment is characterized in that such a phase compensation element as shown in each of FIGS. 10 to 12 is arranged between input/output terminals of the inverter IV2 on the second stage constituting the AMP 17 which amplifies an output from the DAC 16. By arranging such a phase compensation element, phase compensation (appropriate adjustment of a propagation speed of a signal) is effected, thereby preventing oscillation of the AMP 17 and ringing.

Here, oscillation means that an output voltage of the AMP 17 oscillates in the vicinity of a desired potential and can not converge. This oscillation occurs when the signal propagation speed of the loop of the inverters on the odd number of stages which are cascade-connected is too high and an output from the AMP 17 oscillates and is propagated to the signal line as it stand. For example, oscillation occurs when an absolute value of Vth is small and the load drive capability of each inverter is too high.

On the other hand, ringing means that a convergence speed to a desired value is too slow. Ringing occurs when a signal propagation speed of the loop of the inverters on the odd number of stages which are cascade-connected is too low and feedback of the potential of the signal line is too slow. For example, it occurs when an absolute value of Vth is too large and the load drive capability of each inverter is too low.

As a result of trial and error, the present inventor found the following means as means for stabilizing the operation of the AMP 17 and succeeded in exponential improvement in the operation stability of the AMP 17.

As shown in FIG. 10, since the phase compensation element consisting of the resistance element Ra and the capacitor element C7 which are connected to each other in series is provided between the input and the output of the inverter IV2 on the second stage, oscillation hardly occurs even if an absolute value of Vth becomes smaller. It is good enough that the resistance value of Ra or the capacitance of C7 is determined while taking the layout into consideration so that a product of Ra and C7 becomes approximately a predetermined value. A predetermined value should be the order of a value of the product of the resistance Rsig extending from the an output of the AMP 17 to the signal line and the signal line capacitance Csig. Furthermore, more desirably, approximately 0.5-fold to 3-fold of Csig×Rsig can suffice.

The circuit shown in FIG. 10 prevents oscillation by cutting off a frequency component in the signal line load which tends to oscillate by the impedance element Ra and the capacitor element C7. Moreover, when the capacitor element is set too large, a problem of increase in a circuit area and that in drive load of the inverter on the first stage occur, and the convergence property deteriorates, thereby readily causing ringing.

It is to be noted that the capacitor element C7 shown in FIG. 10 may be inserted between the input and output terminals of the inverter IV3 on the third stage constituting the AMP 17.

FIG. 11 is a modification of FIG. 10 and characterized in that a phase compensation element consisting of a resistance element Ra and a capacitor element C7 such as shown in the drawing is inserted between an output end of the inverter IV2 on the second stage and one end of the capacitor element C4 inserted between the inverter IV1 on the first stage and the inverter IV2 on the second stage. By inserting such a capacitor element C7, the advantage of prevention of oscillation can be obtained as similar to FIG. 10, and a quantity of reduced gain can be suppressed as compared with FIG. 10. In addition, since the convergence speed is improved, ringing can be prevented even if an absolute value of Vth increases. In this case, as to the largeness of the capacitance of the capacitor element C7, not more than ½ of the capacitance of the capacitor element C4 can suffice. If the capacitance is too large, a problem of increase in a circuit area and that of increase in drive load of the inverter on the fist stage occur, and the convergence property deteriorates, thereby readily causing ringing.

Additionally, as a modification of FIG. 11, a resistance element R6 may be inserted between the newly inserted capacitor element C7 and an output terminal of the inverter IV2 on the second stage as shown in FIG. 12. The capacitor element C7 and the resistance element R6 may be counterchanged. This resistance element R6 performs phase compensation as similar to the capacitor element C7. That is, providing the resistance element R6 can improve the accuracy of phase compensation. The effects/advantages are similar to those in FIG. 11. Any configuration can be selected based on easiness of layout, matching with the process or the like.

Alternatively, in place of the resistance element R6, one electrode of the newly added capacitor element C7, or more concretely, an electrode C7a connected to the output end of the inverter IV2 on the second stage may be formed of a high-resistance material as shown in FIG. 13. As a result, the advantage similar to that of the case where the resistance element R6 is connected can be obtained without additionally connecting the resistance element R6.

(Sixth Embodiment)

Figure 14:
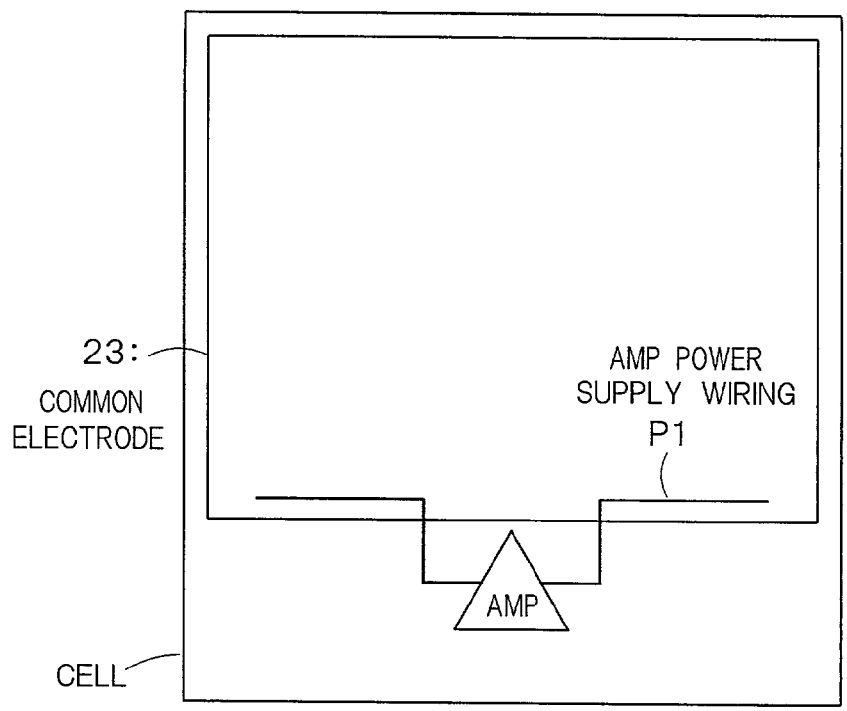
FIG. 14 is a view showing an example in which a power supply wiring pattern of the AMP 17 is arranged so as to overlap a common electrode.

There is a demand for reducing frame size of a liquid crystal display apparatus used in a portable device such as a mobile phone or a notebook computer. Thus, in the sixth embodiment, a power supply wiring pattern P1 of the AMP 17 which amplifies an output from the DAC 16 is arranged at a position overlapping a common electrode 23 on the opposed substrate as shown in FIG. 14. Consequently, the outside dimension of the glass substrate 2 can be reduced, thereby minimizing the frame.

Figure 15:
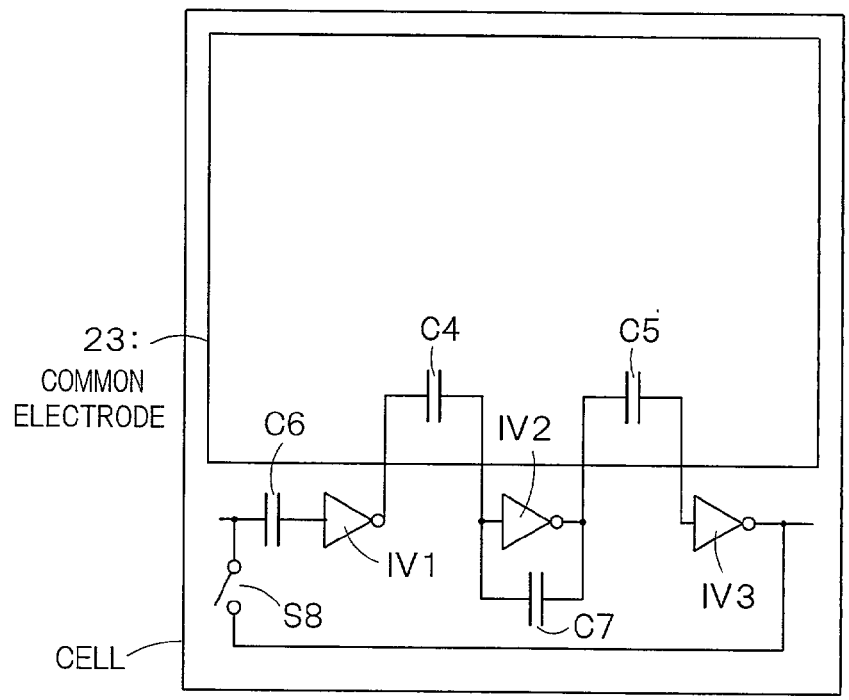
FIG. 15 is a view showing an example in which the capacitor element in the AMP 17 is arranged so as to overlap the common electrode.

As a modification of FIG. 14, the capacitor elements C4 and C5 connected between the stages of the inverters IV1 to IV3 in the AMP 17 may be arranged at positions overlapping the common electrode 23 on the opposed substrate as shown in FIG. 15. Arranging these elements at positions overlapping the common electrode 23 as shown in FIG. 15 can reduce the outside dimension of the glass substrate 2 because the capacitor element requires a larger packaging area as compared with other circuit components.

(Seventh Embodiment)

Figure 16:
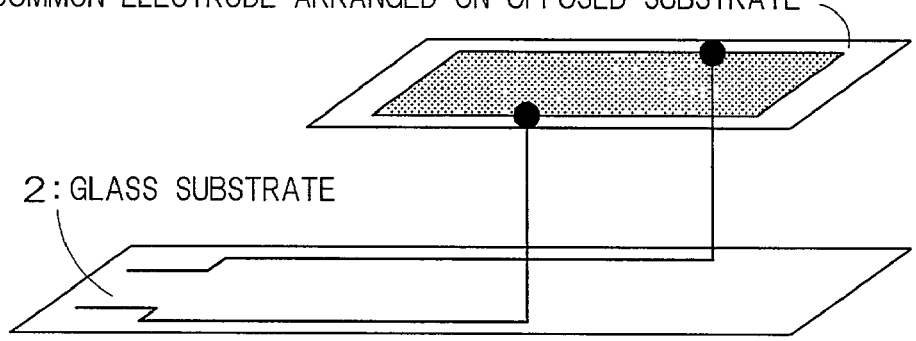
FIG. 16 is a view showing a combined resistance from a common potential supply end on a glass substrate 2.

When a combined resistance Rcom from a common potential supply end on the glass substrate is high, the voltage level of the common electrode 23 formed on the opposed substrate may not possibly reach a desired value within a predetermined period of time. This combined resistance Rcom is a resistance indicated by heavy lines in FIG. 16.

As a countermeasure, in the seventh embodiment, the resistance value of the combined resistance R7 from the common potential supply end is reduced by thickening or shortening the voltage supply line to the common electrode 23.

Concretely, it is desirable to set the resistance value Rcom of the combined resistance R7 from the common potential supply end so as to satisfy the relationship of the following expression (2).

$$Rcom < \text{predetermined coefficient} \times \text{on period of the signal line selection circuit}/(\text{total amount of auxiliary capacitances/capacitance between the common electrode and the insulation substrate})/\text{number of signal lines which simultaneously perform writing} \quad (2)$$

Figure 17:
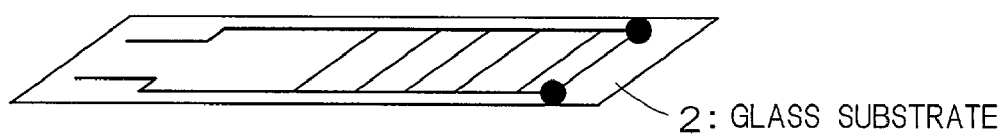
FIG. 17 is a view showing a combined resistance from an auxiliary capacity potential supply end.

Furthermore, when the combined resistance Rcs from the auxiliary capacitance supply end on the glass substrate is high, the voltage level of the auxiliary capacitance may not possibly reach a desired value with in a predetermined period of time. This combined resistance Rcs is a resistance indicated by heavy lines in FIG. 17.

Thus, as a modification of the seventh embodiment, the resistance value of the combined resistance R7 from the auxiliary capacitance potential supply end may be reduced by thickening or shortening the voltage supply line to the auxiliary capacitance wiring.

Specifically, it is desirable to set the resistance value Rcs of the combined resistance R7 from the auxiliary capacitance potential supply end so as to satisfy the relationship of the following expression (3).

$$Rcs < \text{predetermined coefficient} \times \text{on period of the signal line selection circuit}/(\text{total amount of auxiliary capacitances/capacitance between the common electrode and the insulation substrate})/\text{number of signal lines which simultaneously effect writing} \quad (3)$$

(Eighth Embodiment)

Figure 18A:
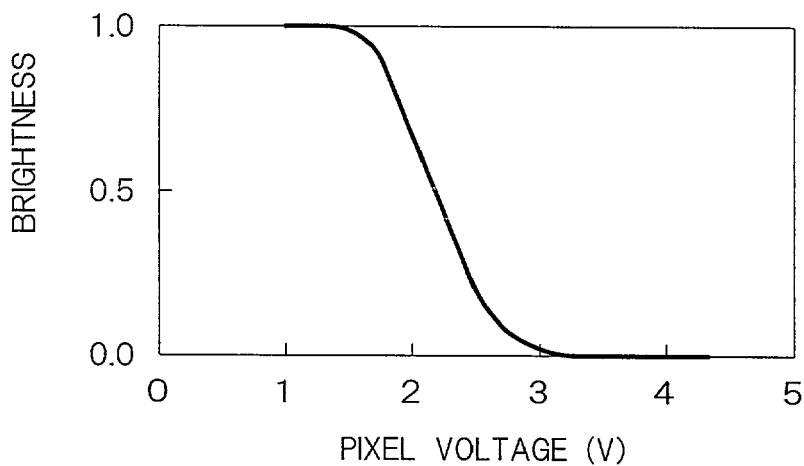
FIG. 18A is a view showing a gain characteristic of the AMP.

FIG. 18A is a voltage-brightness curve at a liquid crystal portion in the liquid crystal display apparatus according to this embodiment. A change in brightness relative to a change in voltage is large in the vicinity of the intermediate voltage, and small at any other voltage as compared with the vicinity of the intermediate voltage. That is, an error voltage of an output from the AMP 17 in the vicinity of the intermediate voltage directly leads to irregularities in display, whereas the error voltage at any other voltage value can not be visually confirmed unless it is quite large. Therefore, it is desirable to set an output error voltage of the AMP 17 to be minimum in the vicinity of the intermediate voltage.

An output error voltage of the AMP 17 according to the present invention is inverse proportion to a product of the gain of each inversion amplification circuit (inverter) in signal line writing. Here, the gain means a gradient (steepness) of an input/output characteristic polarity of the inversion amplification circuit, and the gain varies depending on an input voltage. The present inventor revealed that a complementary inverter having a p-channel TFT and an n-channel TFT connected between power supply voltages in series is optimum as the inversion amplification circuit used in the AMP 17 which drives the signal lines in the liquid crystal display apparatus.

Figure 18B:
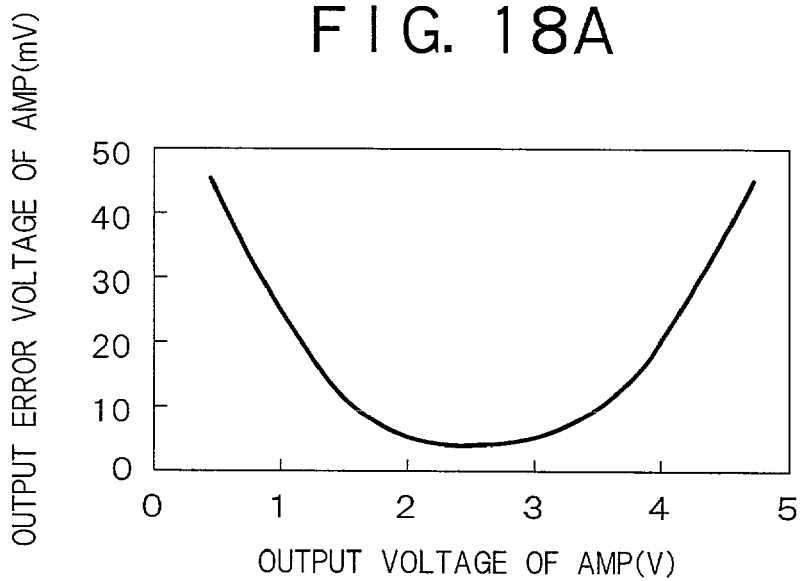
FIG. 18B is a view showing a gain characteristic of the AMP using a complementary inverter.

By adopting this inverter, each inverter operates in the vicinity of each inverter threshold value when writing the intermediate voltage. As shown in FIG. 18B, the gain of the complementary inverter becomes maximum in the vicinity of the threshold value. Any other member, e.g., a source follower can constitute the inversion amplification circuit, but it is difficult to configure so that the error voltage becomes minimum when outputting a voltage in the vicinity of the intermediate voltage.

As a countermeasure, this embodiment uses the complementary inverter in which the p-channel TFT and the n-channel TFT are connected in series between the power supply voltages as the inverter of the AMP 17.

Incidentally, when using a display element other than the liquid crystal display apparatus, the following process is adopted. That is, a voltage range which demonstrates the steepest gradient is checked from the voltage-brightness characteristic view of the display element such as shown in FIG. 18A, and the power supply voltage of each amplification stage and a type of each amplification stage are selected so that the gain of each amplification stage of the AMP becomes maximum in the corresponding range.

(Ninth Embodiment)

Figure 19:
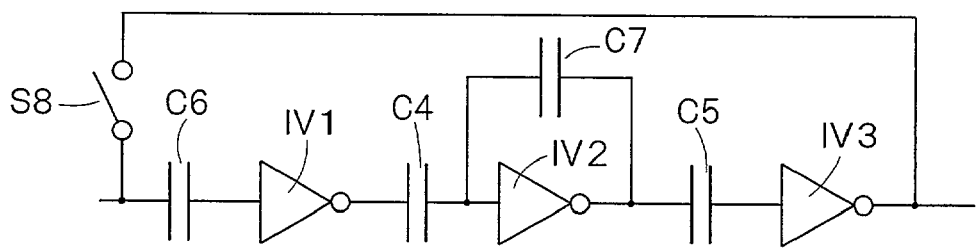
FIG. 19 is a view showing an example of an analog switch on a feedback path is arranged in the vicinity of an input capacitance of the inverter on the first stage.

As shown in FIG. 19, the AMP 17 is constituted by cascade-connecting the inverters on the odd number of stages, and an analog switch 8 and a capacitor element C6 are inserted between the input terminal of the inverter IV1 on the first stage and the output terminal of the inverter IV3 on the last stage.

The inverter IV1 on the first stage has a greatest impact on the gain accuracy of the AMP 17. When the analog switch S8 on the feedback route from the inverter IV3 on the last stage and the input capacitor C6 of the inverter IV1 on the first stage are provided at distanced positions, on/off switching of the analog switch S8 largely influences on the input capacitance of the capacitor of the inverter IV1 on the first stage.

Thus, the ninth embodiment is characterized in that the analog switch S8 on the feedback path and the input capacitor C6 of the inverter IV1 on the first stage are arranged in contiguity with each other. As a result, the input capacitor of the inverter IV1 on the first stage is not affected by on/off switching of the analog switch S8, thereby enabling highly accurate gain adjustment.

(10th Embodiment)

The 10th embodiment unbalances a resistance value of the resistance connected on the power supply line of the AMP 17 and a resistance value of the resistance connected on the ground line.

Figure 20:
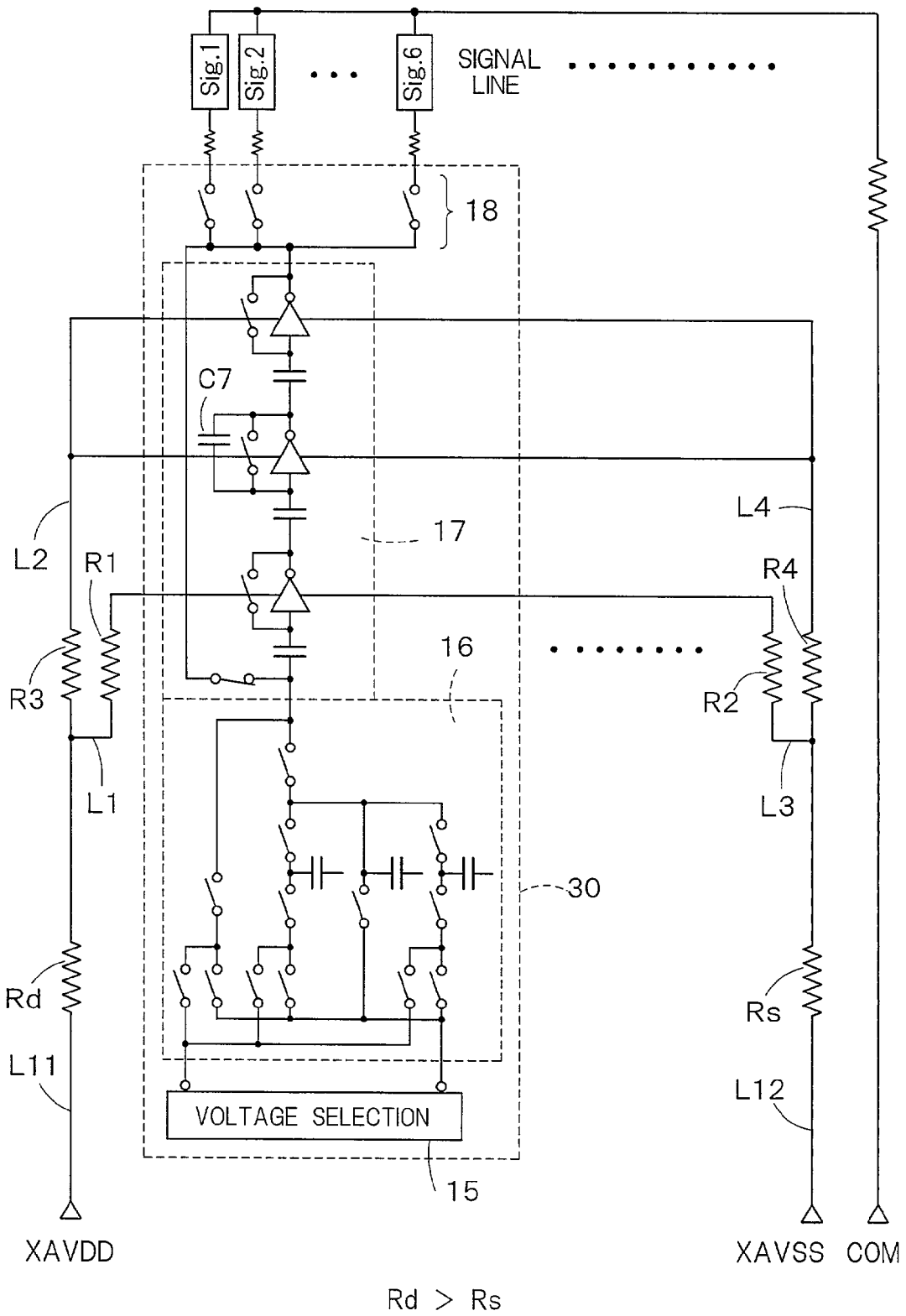
FIG. 20 is a circuit diagram showing a 10th embodiment of the signal line drive circuit.

FIG. 20 is a circuit diagram showing the 10th embodiment of the signal line drive circuit. Although the signal line drive circuit illustrated in FIG. 20 is the same as the signal line drive circuit depicted in FIG. 3 in terms of the circuit configuration, a sum total of resistance values of the resistances R1, R3 and Rd connected on the power supply line L11 (including the power supply lines L1 and L2) connected to the inverter in the AMP 17 is set greater than that of resistance values of the resistances R2, R4 and Rs connected on the ground line L12 (including the ground lines L3 and L4). Here, the resistances Rd and Rs are resistances provided to the outside of the glass substrate, and the resistances R1 to R4 are resistances formed in the glass substrate.

The voltage selection circuit 15, the DAC 16, the AMP 17 and the signal selection circuit 18 in FIG. 20 form one set of circuits. This set of circuits is integrally formed on the same glass substrate.

Figure 21:
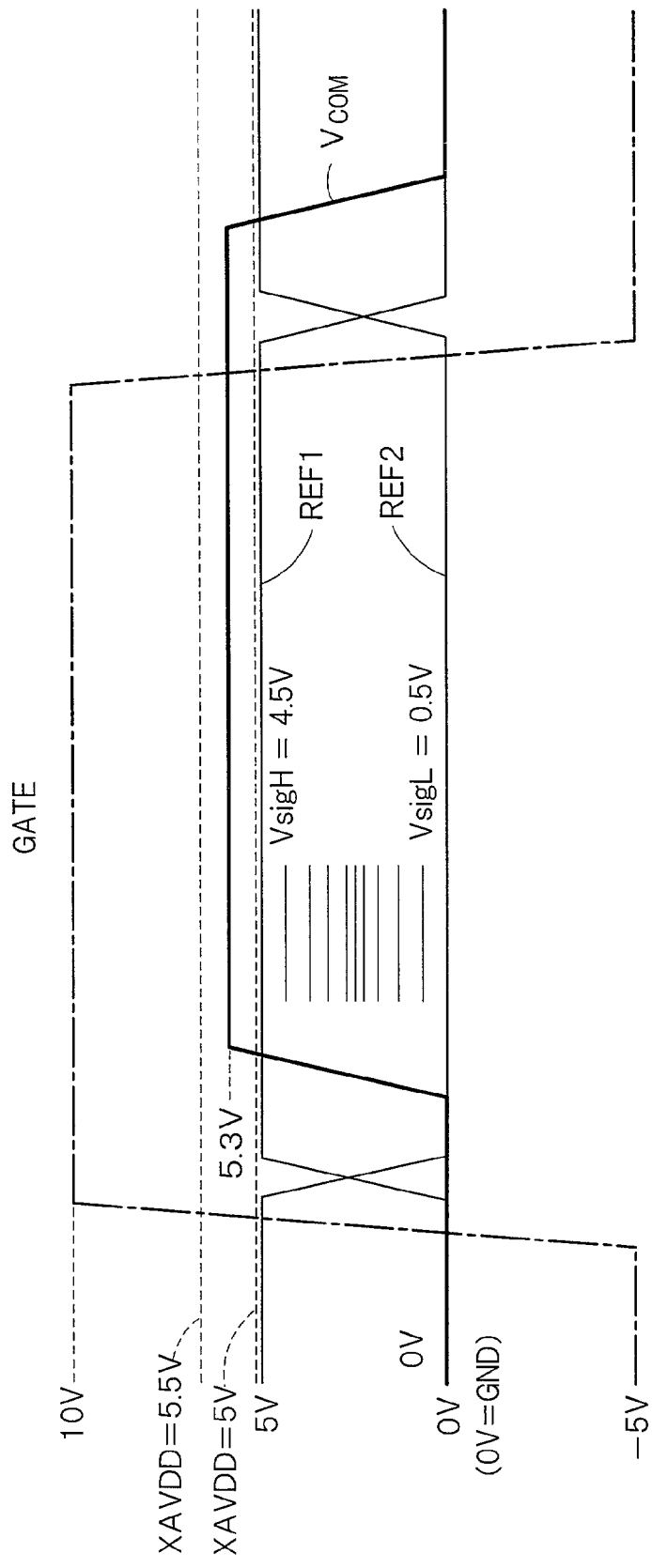
FIG. 21 is a view showing a voltage level of each portion in the liquid crystal display apparatus according to the embodiment.

FIG. 21 is a view showing a voltage level of each portion in the liquid crystal display apparatus according to this embodiment. A power supply voltage XVDD (=5 V) is a power supply voltage supplied to the shift register 11, the data bus 12, the sampling latch 13, the load latch 14, the voltage selection circuit 15, the DAC 16 and the signal line selection circuit 18 shown in FIG. 1. A power supply voltage XAVDD (=5.5 V) is a power supply voltage supplied to the inverters IV1, IV2 and IV3 of the AMP 17 depicted in FIG. 1. A voltage Gate is a gate voltage of a pixel drive TFT. A common voltage VCOM is a voltage of 0 V or 5.3 V and has alternate values in a predetermined cycle. Signal voltages VsigH and VsigL are signal voltages outputted from the AMP 17, and their maximum voltage is VsigH (=4.5 V) whilst their minimum voltage is VsigL (=0.5 V). Voltages REF1 and REF2 are reference voltages supplied to the voltage division resistance ladder 20, and values of REF1 and REF2 alternately changes from 0 V to 5V or from 5 V to 0V in accordance with the drive cycle of VCOM.

As apparent from FIG. 21, a potential difference between the power supply voltage XAVDD and the maximum value VsigH of the signal voltage is 1.0 V, whereas a potential difference between the ground voltage 0 V and the minimum value VsigL of the signal voltage is 0.5 V. That is, as shown in FIG. 22, there is a margin of 1.0 V on the power supply voltage side, whereas there is only a margin of 0.5V on the ground voltage side. In FIG.22, a quantity of fluctuation in voltage of the signal voltages VsigH and VsigL is represented by $\Delta$. In this case, the margin $\Delta V1$ on the power supply voltage side is $\Delta V1=XAVDD-(VsigH+\Delta)$, and the margin $\Delta V2$ on the ground voltage side is $\Delta V2=(VsigL-\Delta)-XAVSS$.

When the resistances are respectively connected to the power supply line L11 and the ground line L12, the voltage drops at the both ends of these resistances. Therefore, the voltage of the power supply terminal of the AMP 17 is lowered, and the voltage of the ground terminal of the same increases. However, if a drop in voltage falls within a range of the above-described margin, the AMP 17 normally operates. For example, consideration will be given on the case where resistance values of the resistances respectively connected to the power supply line L11 and the ground line L12 are set equal to each other and the resistance values of these resistances are gradually increased. As the resistance value is increased, a drop in voltage between both ends of each resistance becomes larger. As described above, since the margin on the ground voltage side is smaller, the ground voltage side first deviates from the margin. In order to prevent the ground voltage side from deviating from the margin before the other side, setting the resistance value of the resistance on the ground voltage side smaller than the resistance value of the resistance on the ground voltage side can suffice.

Thus, in this embodiment, a sum total of the resistance values of the resistances connected to the power supply line L11 is set larger than a sum total of the resistance values of the resistances connected to the ground line L12. As a result, the similar margin can be assured on both the power supply line side and the ground line side, and setting the resistance values on the power supply line L11 side larger can reduce the current flowing through the power supply line L11, thereby decreasing power consumption.

It is to be noted that the advantage of reduction in power consumption is particularly effective when an absolute value of Vth of each TFT element constituting the inverter of the AMP 17 is small. Since a voltage applied to the gate of each inverter of the AMP 17 is constantly 0.5 to 4.5 V, a through current flows to each inverter. When the absolute value of Vth is small, a quantity of this through current increases.

In this embodiment, since the resistance is provided to the power supply line, an effective voltage applied to the inverter is reduced by an amount corresponding to a product of the current×the resistance, and there is an effect to suppress the through current. On the other hand, when the absolute value of Vth is large, a quantity of the through current is relatively small, and a product of the current×the resistance is also small. Further, as to the effective voltage applied to the inverter, power supply voltage is almost directly applied, thereby assuring the maximum current drive capability.

From such a reason, the technique according to this embodiment is particularly suitable for the case where the polysilicon TFTs with large irregularities in Vth are formed on the glass substrate and the pixel portion and the drive portion of the display apparatus are integrally formed.

Although FIG. 20 shows the example that the resistances R1 and R2 are provided on the power supply lines L1 and L2 and the resistances R3 and R4 are provided on the ground lines L3 and L4 in the glass substrate and the resistances Rd and Rs are provided outside the glass substrate, a number of resistances provided on each line is not restricted. Furthermore, all resistances may be formed in the glass substrate, or all resistances may be provided outside the glass substrate.

(11th Embodiment)

The 11th embodiment supplies a power supply voltage to each inverter in the AMP 17 through individual resistances.

FIG. 23 is a circuit diagram showing the 11th embodiment of the signal line drive circuit. The signal line drive circuit in FIG. 23 is common to the circuit configuration of the illustrated signal line drive circuit except for a point that arrangement of the power supply line connected to each inverter in the AMP 17 is different.

Resistances R11, R12 and R13 are respectively connected between the power supply terminal of each of the three cascade-connected inverters IV1, IV2 and IV3 in the AMP 17 and the reference power supply terminal T1 which supplies the power supply voltage XAVDD from the outside. These resistances R11 to R13 may be formed in the glass substrate or externally formed to the glass substrate.

A resistance value Rd1 of the resistance R11 connected to the inverter IV1 on the first stage, a resistance value Rd2 of the resistance R12 connected to the inverter on the second stage and a resistance value Rd3 of the resistance R13 connected to the inverter IV3 on the last stage are set so as to satisfy the relationship of, e.g., Rd2<Rd3<Rd1. More specifically, they are set so as to satisfy the relationship of Rd1=2 kΩ, Rd2=200 Ω and Rd3=700 Ω, for example.

The resistance value Rd1 of the resistance R11 on the first stage is set largest in order to reduce the power supply voltage supplied to the inverter IV1 for the purpose of decreasing power consumption since it is good enough for the inverter IV1 on the first stage to operate only in the vicinity of the threshold voltage.

The resistance value Rd3 of the resistance on the last stage is set such a value as that a voltage with a desired voltage amplitude can be outputted from the inverter IV3. In addition, when the resistance value Rd2 of the resistance on the second stage is increased, the AMP 17 may possibly oscillate. Therefore, the resistance value Rd2 is set to a small value.

In this manner, in this embodiment, the resistance on the power supply line which supplies the power supply voltage to each of the inverters IV1 to IV3 in the AMP17 is individually provided in accordance with each inverter, and the resistance values of the respective resistances R11 to R13 are set to optimum values in conformity with the roles of the inverters IV1 to IV3. Accordingly, the performance of the AMP 17 can be improved while reducing power consumption.

(12th Embodiment)

The 12th embodiment adjusts the size of each inverter in the AMP 17.

Figure 24:
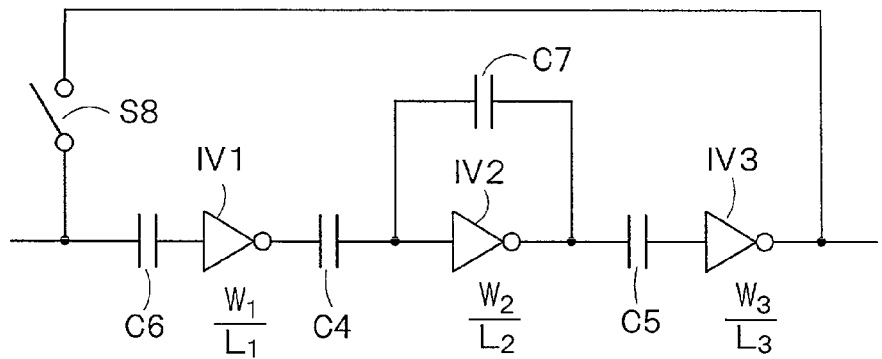
FIG. 24 is a circuit diagram showing the AMP in the signal line drive circuit according to a 12th embodiment.

FIG. 24 is a circuit diagram showing the AMP 17 in the signal line drive circuit according to the 12th embodiment. As shown in the drawing, the AMP 17 has: three cascade-connected inverters IV1 to IV3; capacitor elements C4 and C5 connected between the stages of the respective inverters IV1 to IV3; an analog switch S8 and a capacitor element C6 connected between an output terminal of the inverter IV3 on the last stage and an input terminal of the inverter IV1 on the first stage in series; and a capacitor element for phase compensation C7 connected between input and output terminals of the inverter IV2.

In this embodiment, the size of the inverter IV2 on the second stage is set equal to or larger than the size of the inverter IV3 on the last stage, and the size of the inverter IV1 on the first stage is set equal to or smaller than the size of the inverter IV2 on the second stage.

Although a number of stages of the inverters in the AMP 17 is three in FIG. 24, a number of stages is not restricted as long as it is an odd number equal to or larger than three. For example, when the inverters on (2n+1) stages (n is an integer not less than 1) are cascade-connected in the AMP 17, the gate widths W1 to W2n+1 and the gate lengths L1 to L2n+1 of the transistors constituting the inverters on the respective stages are set so as to satisfy the following relationship.

$$W2n/L2n \geq W2n+1/L2n+1$$

$$W2n-1/L2n-1 \geq W2n+1/L2n+1$$

$$\ldots$$

$$W2/L2 \geq W2n+1/L2n+1$$

$$W1/L1 \leq W2/L2$$

The reason of satisfying the above relationship is as follows.

Since the inverter IV1 on the first stage also functions as an input signal stage, the parasitic capacitance increases when the size of this inverter is enlarged, which affects the accuracy of the AMP 17. Therefore, the size of this inverter can not be increased immoderately.

Moreover, the size of the inverter IV3 on the last stage must be essentially determined based on the signal line load on the last stage. When the size of this inverter increases, the drive capability relative to the signal line load becomes too large, which deteriorates the stability of the AMP 17.

On the other hand, when the size of the inverter IV2 on the second stage is set larger than that of the inverter IV3 on the last stage, the response speed of the inverter IV2 on the second stage becomes too high, thereby improving the operation speed of the AMP 17.

Incidentally, it is good enough that a number of stages of the inverters in the AMP 17 is an odd number equal to or larger than three.

Setting the size of each inverter in the AMP 17 so as to satisfy the relationship of the expression (1) in this manner can improve the accuracy of the AMP 17 and also increase the operation speed.

(13th Embodiment)

The 13th embodiment sets the size of the inverter on the last stage in the AMP 17 equal to or smaller than the size of the signal line selection circuit.

Figure 25:
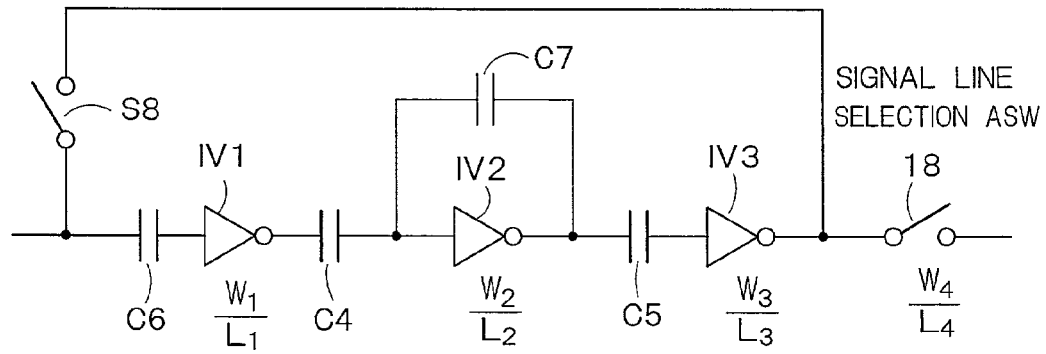
FIG. 25 is a circuit diagram of the AMP and the signal line selection circuit in the signal line drive circuit according to a 13th embodiment.

FIG. 25 is a circuit diagram showing the AMP 17 and the signal line selection circuit 18 in the signal line drive circuit according to the 13th embodiment.

The configuration of the AMP 17 is the same as that shown in FIG. 24 and has the three cascade-connected inverters IV1 to IV3. In this embodiment, the size of the inverter IV3 on the last stage is set equal to or smaller than the size of the signal line selection circuit 18. More specifically, assuming that W3 and L3 are respectively a gate width and a gate length of the transistor constituting the inverter IV3 on the last stage are W4 and L4 are respectively a gate width and a gate length of the transistor in the signal line selection circuit 18, the following relationship is satisfied.

$$W4/L4 \geq W3/L3$$

The above relationship is satisfied because feedback of the AMP 17 is too fast when the ON resistance of the signal line selection circuit 18 increases, and the AMP 17 may possibly oscillate. At this moment, the cascade-connected IV1 to IV3 operates as similar to the ring oscillator circuit (oscillation circuit), and hence oscillation intensifies.

Figure 26:
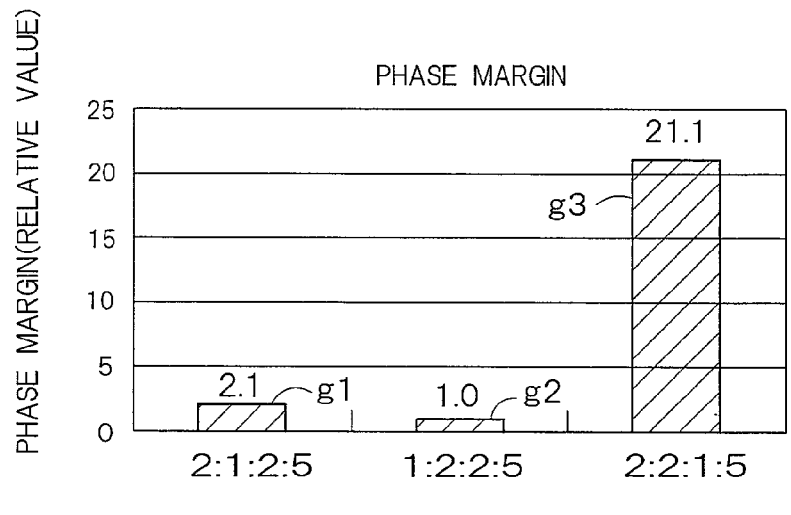
FIG. 26 is a view showing how the phase margin changes.

FIG. 26 is a view showing how the phase margin indicative of incidence of oscillation varies when the size of the inverters IV1 to IV3 in the AMP 17 and the size of the signal line selection circuit 18 are changed in many ways. The graph g1 in FIG. 26 shows the case where the size ratio is 2:1:2:5, the graph g2 shows the case where the size ratio is 1:2:2:5, and the graph g3 shows the case where the size ratio is 2:2:1:5.

From FIG. 26, it can be understood that the degree of the phase margin becomes highest in case of the graph g3, namely, when the size of the inverter IV3 on the last stage is smaller than the sizes of the other inverters IV1 and IV2 and the signal line selection circuit 18. Based on this, it can be comprehended that oscillation hardly occurs when the condition of (2) is satisfied.

As described above, since the size of the inverter IV3 on the last stage in the AMP 17 is set to be equal to or smaller than the size of the signal line selection circuit 18 in this embodiment, oscillation of the AMP 17 can be assuredly avoided.

Incidentally, although a number of stages of the inverters in the AMP 17 is three in this embodiment as shown in FIG. 24, an odd number of stages equal to or above three can be similarly applied.

(14th Embodiment)

The 14th embodiment adjusts the resistance value of the resistance element connected to the power supply terminal of the inverter on each stage in the AMP 17.

Figure 27:
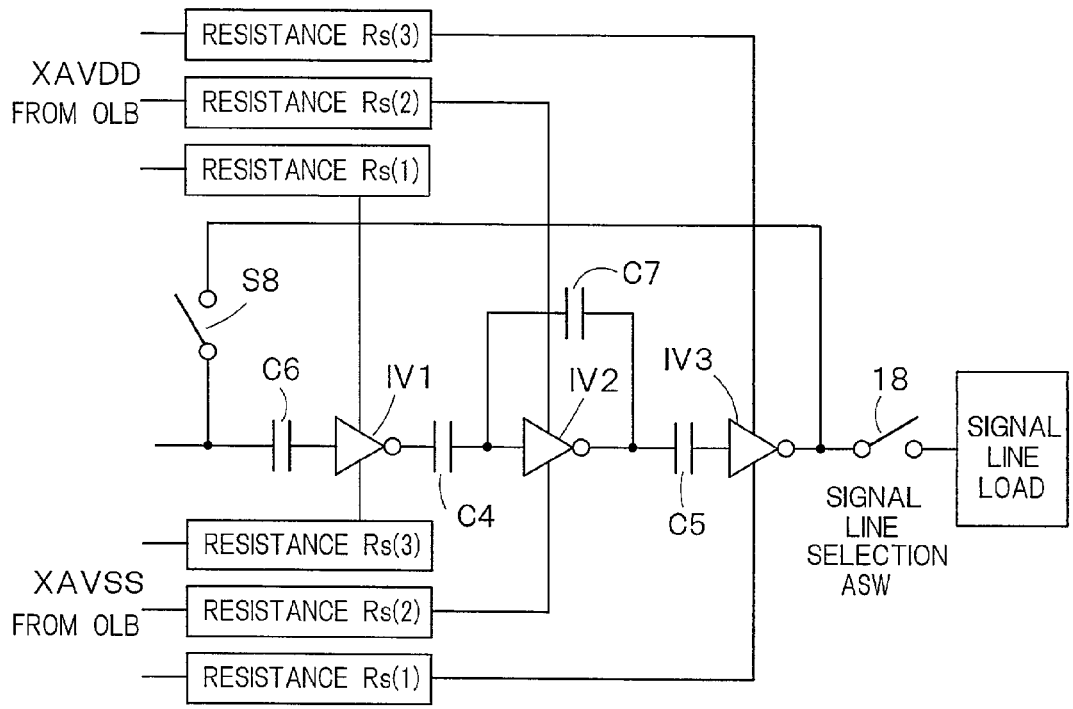
FIG. 27 is a circuit diagram showing the AMP in the signal line drive circuit according to a 14th embodiment.

FIG. 27 is a circuit diagram of the AMP 17 in the signal line drive circuit according to the 14th embodiment. The AMP 17 in FIG. 27 has three inverters IV1 to IV3 which are cascade-connected as similar to the AMP 17 in FIG. 24. Each of the inverters IV1 to IV3 has a power supply terminal Vdd and a ground terminal Vss, and resistant elements Rv(1), Rv(2) and Rv(3) are individually connected between the power supply terminal Vdd and a reference voltage terminal XAVDD of each inverter. Similarly, resistance elements Rs(1), Rs(2) and Rs(3) are individually connected between the ground terminal Vss and the ground voltage terminal XAVSS of each of the inverters IV1 to IV3.

A resistance value of the resistance element Rv(2) on the second stage is set to be not more than a resistance value of the resistance element Rv(3) on the third stage, and a resistance value of the resistance element Rv(1) on the first stage is set to be not less than a resistance value of the resistance element Rv(2) on the second stage.

Similarly, a resistance value of the resistance element Rs(2) on the second stage is set to be not more than a resistance value of the resistance element Rs(3) on the third stage, and a resistance value of the resistance element Rs(1) on the first stage is set to be not less than a resistance value of the resistance element Rs(2) on the second stage.

In FIG. 27, although a number of stages of the inverters in the AMP 17 is three, a number of stages is not limited as long as it is an odd number equal to or above three. For example, when inverters on (2n+1) stages (n is an integer not less than 1) are cascade-connected in the AMP 17, the resistance elements Rv(1) to Rv(2n+1) respectively connected to the power supply terminals of the inverters on the respective stages must satisfy the following relationship:

$$Rv(2n) \leq Rv(2n+1)$$

$$Rv(2n-1) \leq Rv(2n+1)$$

$$\ldots$$

$$Rv(2) \leq Rv(2n+1)$$

$$Rv(1) \geq Rv(2)$$

Alternatively, the resistance elements Rs(1) to Rs(2n+1) respectively connected to the ground terminals of the inverters on the respective stages must satisfy the following relationship:

$$Rs(2n) \leq Rs(2n+1)$$

$$Rs(2n-1) \leq Rs(2n+1)$$

$$\ldots$$

$$Rs(2) \leq Rs(2n+1)$$

$$Rs(1) \geq Rs(2)$$

In this manner, since the resistance value of each resistance element connected to the power supply terminal or the ground terminal of the inverter on each stage in the AMP 17 can satisfy the above relationship in the above embodiment, the effect and advantage similar to those in the 12th embodiment can be obtained. That is, the drive capability of the inverter on each stage can be optimally adjusted by controlling the resistance value of each resistance element, thereby improving the accuracy and the operation speed of the AMP 17.

(15th Embodiment)

The 15th embodiment supplies an individual power supply voltage to the inverter on each stage in the AMP 17.

Figure 28:
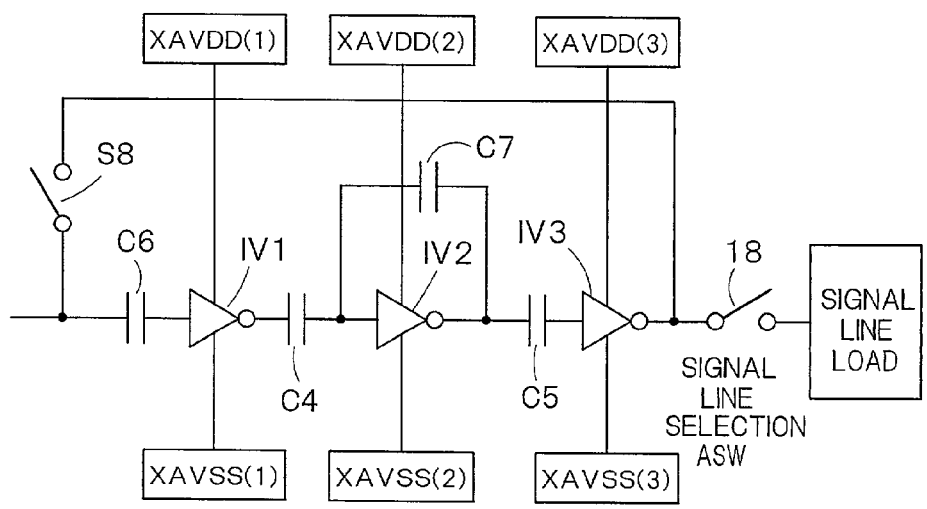
FIG. 28 is a circuit diagram showing the AMP in the signal line drive circuit according to a 15th embodiment.

FIG. 28 is a circuit diagram of the AMP 17 in the signal line drive circuit according to the 15th embodiment. The AMP 17 in FIG. 28 has three inverters IV1 to IV3 which are cascade-connected as similar to the AMP 17 in FIG. 24. Each of the inverters IV1 to IV3 has first and second power supply terminals Vdd and Vss. Different types of power supply voltages XAVDD(1), XAVDD(2) and XAVDD(3) are supplied to the first power supply terminals Vdd of the inverters IV1 to IV3 on the respective stages. Similarly, different types of power supply voltages XAVSS(1), XAVSS(2) and XAVSS(3) are supplied to the second power supply terminals Vss of the inverters IV1 to IV3 on the respective stages.

The power supply voltage XAVDD(2) to be supplied to the inverter IV2 on the second stage is set to be not less than the power supply voltage XAVDD(3) to be supplied to the inverter IV3 on the last stage, and the power supply voltage XAVDD(1) to be supplied to the inverter IV1 on the initial stage is set to be not more than the power supply voltage XAVDD(2) to be supplied to the inverter IV2 on the second stage.

Alternatively, the power supply voltage XAVSS(2) to be supplied to the inverter IV2 on the second stage is set to be not more than the power supply voltage XAVSS(3) to be supplied to the inverter IV3 on the last stage, and the power supply voltage XAVSS(1) to be supplied to the inverter IV1 on the initial stage is set to be not less than the power supply voltage XAVSS(2) to be supplied to the inverter IV2 on the second stage.

In FIG. 28, although a number of stages of the inverters in the AMP 17 is three, a number of stages is not limited as long as it is an odd number equal to or above three. For example, when inverters on (2n+1) stages (n is an integer not more than 1) are cascade-connected in the AMP 17, the power supply voltages XAVDD(1) to XAVDD(2N+1) to be respectively supplied to the first power supply terminals Vdd of the inverters on the respective stages must satisfy the following relationship:

$$XAVDD(2n) \geq XAVDD(2n+1)$$

$$XAVDD(2n-1) \geq XAVDD(2n+1)$$

$$\ldots$$

$$XAVDD(2) \geq XAVDD(2n+1)$$

$$XAVDD(1) \leq XAVDD(2)$$

Alternatively, the power supply voltages XAVSS(1) to XAVSS(2N+1) respectively supplied to the second power terminals Vss of the inverters on the respective stages are set so as to satisfy the following relationship:

$$XAVSS(2n) \leq XAVSS(2n+1)$$

$$XAVSS(2n-1) \leq XAVSS(2n+1)$$

$$\ldots$$

$$XAVSS(2) \leq XAVSS(2n+1)$$

$$XAVSS(1) \geq XAVSS(2)$$

As described above, in this manner, since the power supply voltage to be supplied to the inverter on each stage in the AMP 17 is individually adjusted, the drive capability of the inverter on each stage can be optimally controlled, thereby improving the accuracy and the operation speed of the AMP 17.

Further, since the similar effect and advantage can be obtained by simultaneously using (the 12th embodiment), (the 13th embodiment), (the 14th embodiment) and (the 15th embodiment), the drive capability of the inverter on each stage can be optimally adjusted, thereby improving the accuracy and the operation speed of the AMP 17.

(16th Embodiment)

The 16th embodiment executes sampling of an analog video signal and writing to the signal line in parallel.

FIG. 29A is a circuit diagram of the AMP 17 in the signal line drive circuit according to the 16th embodiment. The AMP 17 in FIG. 29A constitutes an inverter on the first stage by two first amplification portions 31 connected in parallel. Each of these first amplification portions 31 has a switch S21, a capacitor element C6a, an inverter IV1a and a switch S22 which are connected in series, and a switch S23 which is connected in parallel between input and output terminals of the inverter IV1a. These first amplification portions 31 are connected to a second amplification portion 32. The second amplification portion 32 is constituted by a capacitor element C4, an inverter IV2, a capacitor element C5 and an inverter IV3 which are connected in series. Furthermore, although not shown, a phase compensation element shown in FIG. 11 is provided as the inverter on the second stage.

Each AMP 17 shown in FIG. 25 is provided every six signal lines as shown in FIG. 29B, whereas each AMP 17 in this embodiment is provided every 12 signal lines. Therefore, two inverters can be eliminated with respect to one AMP 17.

FIG. 30A is an operation timing chart of the AMP 17 according to this embodiment, and FIG. 30B is an operation timing chart of the AMP 17 of FIG. 25 shown for the purpose of comparison.

Although the AMP 17 in FIG. 25 alternately performs sampling of the analog video signal and writing into the signal line, the AMP 17 in this embodiment performs sampling and writing into the signal line in parallel. Therefore, it is possible to drive the signal lines whose number is twice as large as those in FIG. 25 without reducing the sampling period and the signal line write period.

Figure 31:
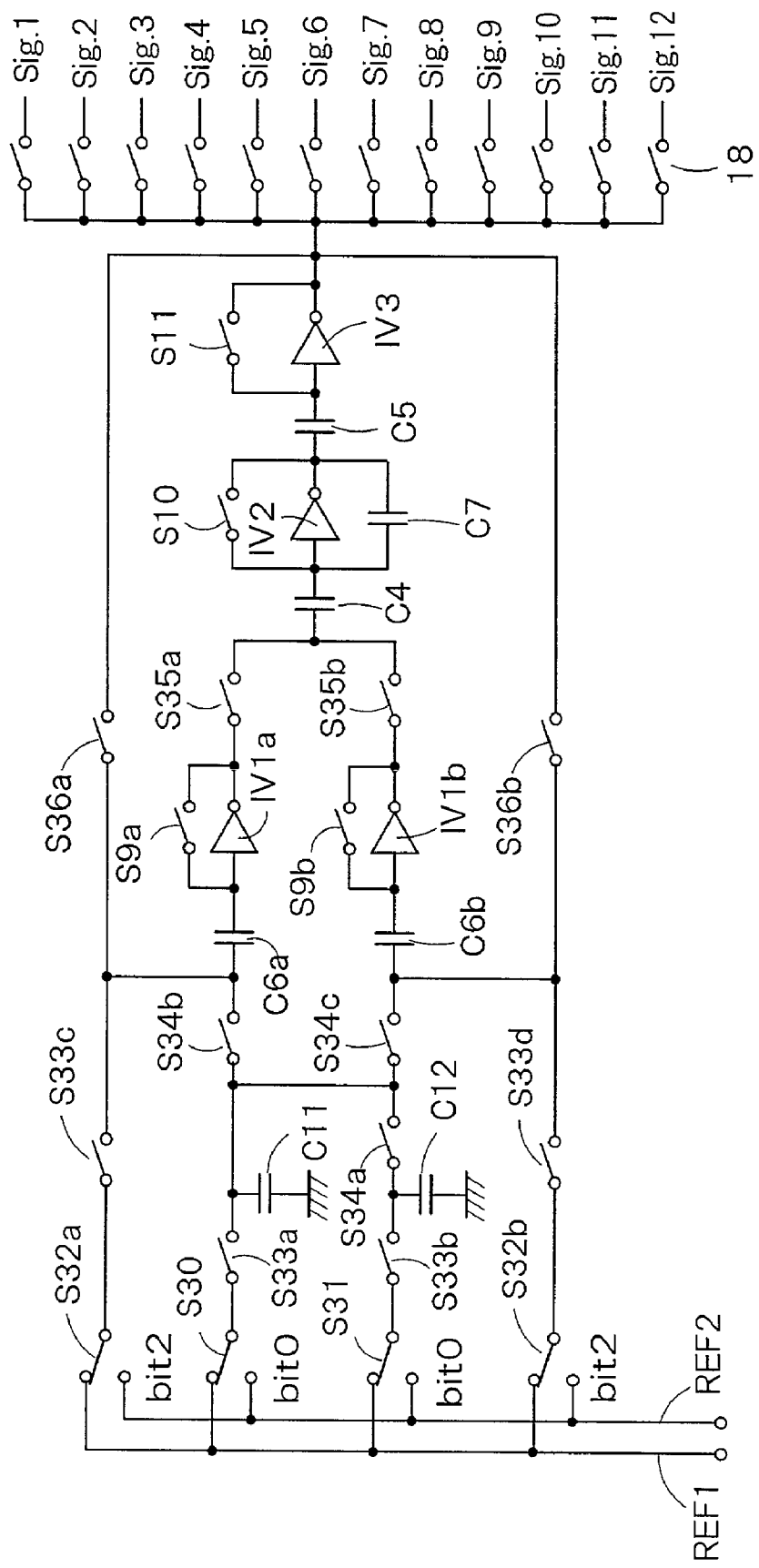
FIG. 31 is a circuit diagram showing the periphery of the AMP 17.

FIG. 31 is a peripheral circuit diagram of the AMP 17, and illustrates a circuit diagram of a DAC 16, an AMP 17 and a signal line selection circuit 18. The DAC 16 has analog switches S30, S31, S32a and S32b which are controlled to be switched in accordance with values of lower three bits b2 to b0 in digital pixel data, a capacitor element C11 which stores the electric charge according to the bit b0, and switches S33a, S33b, S33c, S33d, S34a, S34b and S34c which control storage of the electric charge in the capacitor elements C11 and C12.

Figure 32:
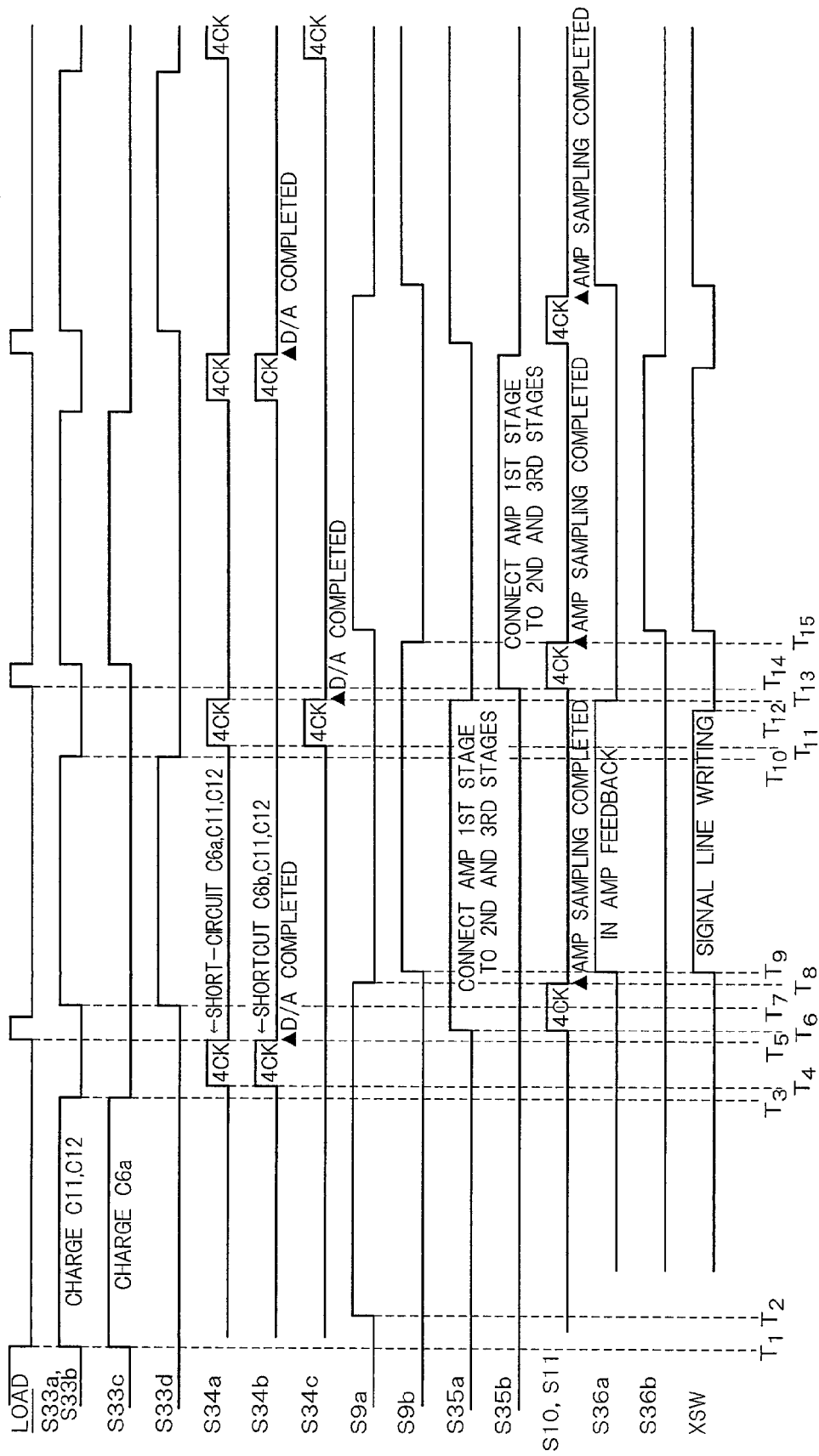
FIG. 32 is an operation timing chart of the circuit illustrated in FIG. 31.

FIG. 32 is an operation timing chart of the circuit illustrated in FIG. 31. At the time T1, the switches S33a, S33b and S33c are first turned on. As a result, the electric charges according to the bits b0 and b1 are stored in the capacitor elements C11 and C12. Thereafter, at the time T2, the switch S9a is turned on, and the electric charge according to the bit b2 is stored in the capacitor element C6a.

Then, after the switches S33a, S33b and S33c are turned off at the time T3, the switches S34a and S34b are turned on in a period from the time T4 to the time T5. Consequently, the electric charge is redistributed between the capacitor elements C11, C12 and C6a.

Then, the switches S10 and S11 are turned on at the time T6, and sampling of the AMP 17 is carried out until the time T8. Thereafter, in a period from the time T9 to the time T12, writing in the signal line is performed.

Moreover, in a period from the time T7 to the time T15, as similar to the period from the time T1 to the time T8, sampling of data which is subsequently written in the signal line is performed.

In this manner, sampling of data and writing in the signal line are executed in parallel by forming the inverters on the first stage in parallel and alternately switching and driving the respective inverters IV1a and IV1b.

Here, power consumption of the AMP 17 is represented by the power supply voltage of the AMP 17×the current per AMP 17×a number of the AMPs 17. Therefore, as with this embodiment, power consumption can be reduced by decreasing a number of the inverters constituting the AMP 17.

(17th Embodiment)

The 17th embodiment sets the power supply voltage XAVDD used for driving the AMP 17 to an integral multiple (for example, twofold) of the power supply voltage VDD supplied from the outside. Although 3 V or lower is general for the power supply voltage of the LSI such as a power supply IC, the power supply voltage must be increased to an appropriate value to be supplied to the signal line drive circuit in order to 1) drive a liquid crystal material and 2)

drive polysilicon having Vth larger than that of the LSI in the drive circuit of the liquid crystal display apparatus. For example, in the twisted nematic liquid crystal which is in most widespread use, a voltage range which is approximately 4 V must be prepared for drive. A voltage value required for driving polysilicon must be approximately a maximum sum of Vth (absolute values) of the P-channel TFT and the N-channel TFT.

FIG. 33 is a circuit diagram showing an example of a booster circuit included in the power supply IC of FIG. 2. This booster circuit generates the power supply voltage XAVDD obtained by doubling the power supply voltage VDD supplied from the outside. The generated power supply voltage XAVDD is used for driving the AMP 17.

The booster circuit of FIG. 33 includes switches SW1$a$ and SW2$a$ connected between an IN(+) terminal and an OUT(+) terminal in series, a capacitor element C13 and a switch SW1$b$ connected between a connection path between the switches SW1$a$ and SW2$a$ and an IN(−) terminal in series, a capacitor element C14 connected between the IN(+) terminal and the IN(−) terminal, switches SW1$b$ and SW2$b$ connected between both terminals of the capacitor element C14 in series, and a capacitor element C15 connected between the OUT(+) terminal and the OUT(−) terminal.

The switches SW1$a$ and SW1$b$ are first turned on. As a result, the electric charge according to an input voltage Vin is stored in the capacitor element C13. Then, the switches 1$a$ and 1$b$ are turned off and the switches SW2$a$ and SW2$b$ are turned on. Consequently, the capacitor element C13 is connected to the input voltage Vin in series, the electric charge according to the voltage which is twofold of the input voltage Vin is stored in the capacitor element C13, and an output voltage V0 becomes 2×Vin.

A booster voltage which is an arbitrary multiple can be generated by connecting the resistance in the booster circuit of FIG. 33. Considering the power supply efficiency, however, it is desirable to generate the voltage which is an integral multiple of the input voltage as shown in FIG. 33. Therefore, in this embodiment, the voltage XAVDD which is an integral multiple of the power supply voltage VDD is generated in the power supply IC4.

The power supply IC4 is mounted on the display apparatus formed on the glass substrate 2, or formed on the glass substrate 2 by using polysilicon TFTs or the like as similar to the display apparatus, or mounted or formed on a substrate different from the glass substrate 2. In any case, since the booster circuit of FIG. 33 does not require the inductance element, integration onto the LSI or integration onto the glass substrate is facilitated.

As shown in FIG. 34, the power supply IC4 generates the power supply voltage XVDD for driving the digital circuit components in the display apparatus and reference voltages REFH and REFL for D/A conversion as well as the power supply voltage XAVDD for driving the AMP 17. Since a quantity of power consumption of the digital circuit components is small, requirement with respect to the power supply voltage XVDD is small. Thus, in this embodiment, in view of improving the efficiency of the circuit design and facilitating manufacture, the voltage level of the power supply voltage XVDD is set to be equal to the power supply voltage XAVDD.

As described above, in the 17th embodiment, since the power supply voltage for driving the AMP 17 is set to an integral multiple of the power supply voltage VDD supplied from the outside, the power supply efficiency can be improved while increasing the drive capability of the AMP 17.

In addition, since the power supply voltage XVDD for driving the digital circuit components in the display apparatus is set to be equal to the voltage level of the power supply voltage XAVDD, the internal structure of the power supply IC4 can be simplified.

(18th Embodiment)

The 18th embodiment is a modification of the 17th embodiment and sets respective power supply voltages in such a manner the sufficient operation margin is assured and power consumption can be minimized even if the characteristic such as Vth of the TFT constituting the AMP fluctuates due to irregularities in manufacture.

In regard to power consumption of the liquid crystal display apparatus in which the DAC 16 or the AMP 17 is integrally formed on the glass substrate by using the polysilicon TFT, a percentage of power consumption of the AMP 17 and that of the voltage division resistance ladder 20 are large. Since the AMP 17 operates while passing the through current to the inverters, its quantity of current consumption is large. For the structure of the power supply IC4, top priority should be given to maximization of the boosting efficiency of the power supply of the AMP 17. Therefore, XAVDD is set to 5.5 V which is twofold of VDD (2.75 V).

On the other hand, since power consumption of the voltage division resistance ladder 20 can be expressed as square/resistance value of the applied voltage, the voltage to be applied to the voltage division resistance ladder 20 should not be unnecessarily increased. Additionally, the voltage irregularity should be not more than 5%. When the voltage irregularity is large, an applied voltage range required for driving the liquid crystal can not be assured, and inefficiency of contrast is caused. Further, when the voltage to be applied to the liquid crystal deviates from a predetermined value, there occurs a problem in display of the intermediate tone. Therefore, as to the voltages to be applied to the both ends of the voltage division resistance ladder 20, one is set to 0 V (GND) and the other is set to 5 V.

The voltage levels of the external power supply voltage VDD, the power supply voltage XAVDD, and the reference voltage maximum value REFH and the reference voltage minimum value REFL to be supplied to the voltage division resistance ladder 20 have such a relationship as shown in FIG. 35. The reference voltage maximum value REFH and the reference voltage minimum value REFL are supplied to the voltage division resistance ladder 20 as reference voltages REF1 and REF2 whose voltage levels are inverted every time polarity inversion occurs.

When voltage setting is carried out in view of reduction in power consumption, as shown in FIG. 35, the signal line drive voltage falls within a range of 0.5 V to 4.5 V and is necessarily biased to 0 V side off from the power supply voltage XAVDD. In order to assure an output voltage of the AMP 17 which falls in a range biased with respect to the power supply voltage of the AMP 17, it is desirable to set values of resistances inserted to the power supply line and the ground line of the inverters in the AMP 17 to be asymmetrical on the power supply line side and the ground line side. The reason of setting the values in this manner is as described above in connection with the 10th embodiment, and the advantage similar to that in the 10th embodiment can be demonstrated by connecting such resistances Ra and Rb as shown in FIG. 36.

Figure 36:
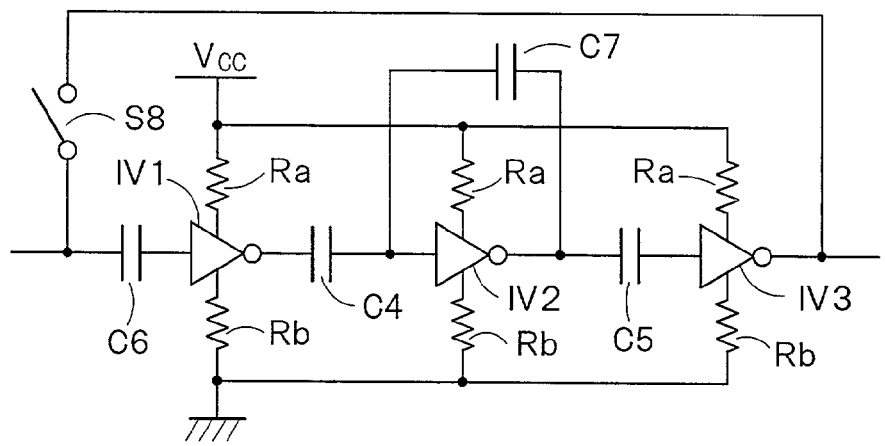
FIG. 36 is a view for illustrating resistances connected to a power supply line and a ground line of the inverter in the AMP.

In FIG. 36, a resistance ratio of the resistance Ra connected between the power supply terminal and the power supply voltage line XAVDD of each inverter in the AMP 17 and the resistance Rb connected between the ground terminal and the ground line GND of each inverter is set to be asymmetrical (for example, Ra:Rb=2:1). As a result, even if irregularities are generated in Vth of the TFT due to the manufacture process of the polysilicon TFT substrate, the stable operation is enabled while minimizing power consumption.

(19th Embodiment)

The 19th embodiment sets a gate width W of the inverter on the second stage larger than a gate width W of the inverter on the third stage among the three inverters constituting the AMP 17. The AMP 17 of the TAB-IC which is generally used for driving signal lines in the display apparatus is designed in such a manner that a gate width of the element of the comparison circuit portion consisting of a different circuit is set as small as possible and a gate width of the element on the output stage is set as large as possible, but the philosophy of the AMP 17 according to this embodiment is considerably different from that of a general AMP.

As a result of test and fault, the inventor found the relative relationship of the gate width of a non-self-evident inverter on each stage which is particularly appropriate for a relatively small display apparatus such as a liquid crystal display apparatus for a mobile phone or a liquid crystal display apparatus for PDA. Here, "relatively small" means that the drive load capacity (capacity per signal line) seen from the AMP 17 is approximately equal to or less than 20 pF.

When constituting the AMP 17 used for driving signal lines by using an element which has a relatively large irregularity in characteristic such as Vth as with the polysilicon TFT element, increasing the output stage is not necessarily effective for assuring the operation stability but apt to lead oscillation or ringing. The inventor found this fact as a result of test and fault, and discovered that it is preferable to decrease the gate width of the TFT constituting the inverter on the last stage and increase the gate width of the second stage.

Figure 37:
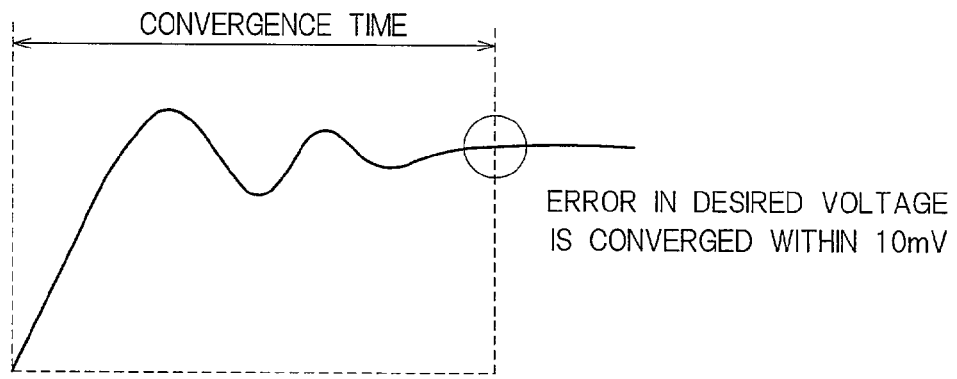
FIG. 37 is a view for illustrating a convergence time of an AMP output.

As shown in FIG. 24 or the like, the AMP 17 is constituted by cascade-connecting three inverters with the capacitor elements sandwiched therebetween. Therefore, an output from the AMP 17 tends to generate oscillation or ringing, and a certain time (which will be referred to as a convergence time hereinafter) is required until the output is stabilized as shown in FIG. 37.

Figure 38:
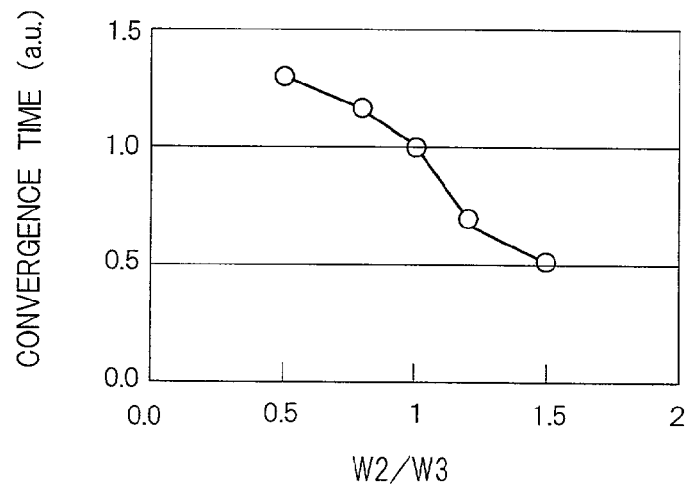
FIG. 38 is a view showing how the convergence time of an output from the AMP 17 changes when a gate width W1 of the inverter on the first stage is equal to a gate width W2 of the inverter on the second stage and a ratio W2/W3 of the gate width W2 of the inverter on the second stage and a gate width W3 of the inverter on the third stage is changed.

FIG. 38 is a view showing how the convergence time of an output from the AMP 17 varies when the gate width W1 of the inverter on the first stage is set equal to the gate width W2 of the inverter on the second stage and a ratio W2/W3 of the gate width W2 of the inverter on the second stage and the gate width W3 of the inverter on the third stage is changed.

As shown in the drawing, when W2/W3 falls within a range of 0.5 to 1.5, it can be understood that the convergence time becomes shorter as the gate width W2 of the inverter on the second stage is larger than the gate width W3 of the inverter on the third stage. Thus, increasing the gate width W2 of the inverter on the second stage to be larger than the gate width W3 of the inverter on the third stage can further stabilize the operation of the AMP 17.

(20th Embodiment)

Description will now be given as to a conformation of a concrete layout of the AMP circuit suitable for using a liquid crystal display apparatus having a diagonal size of 2 inches and 176×180 dots.

Figure 39:
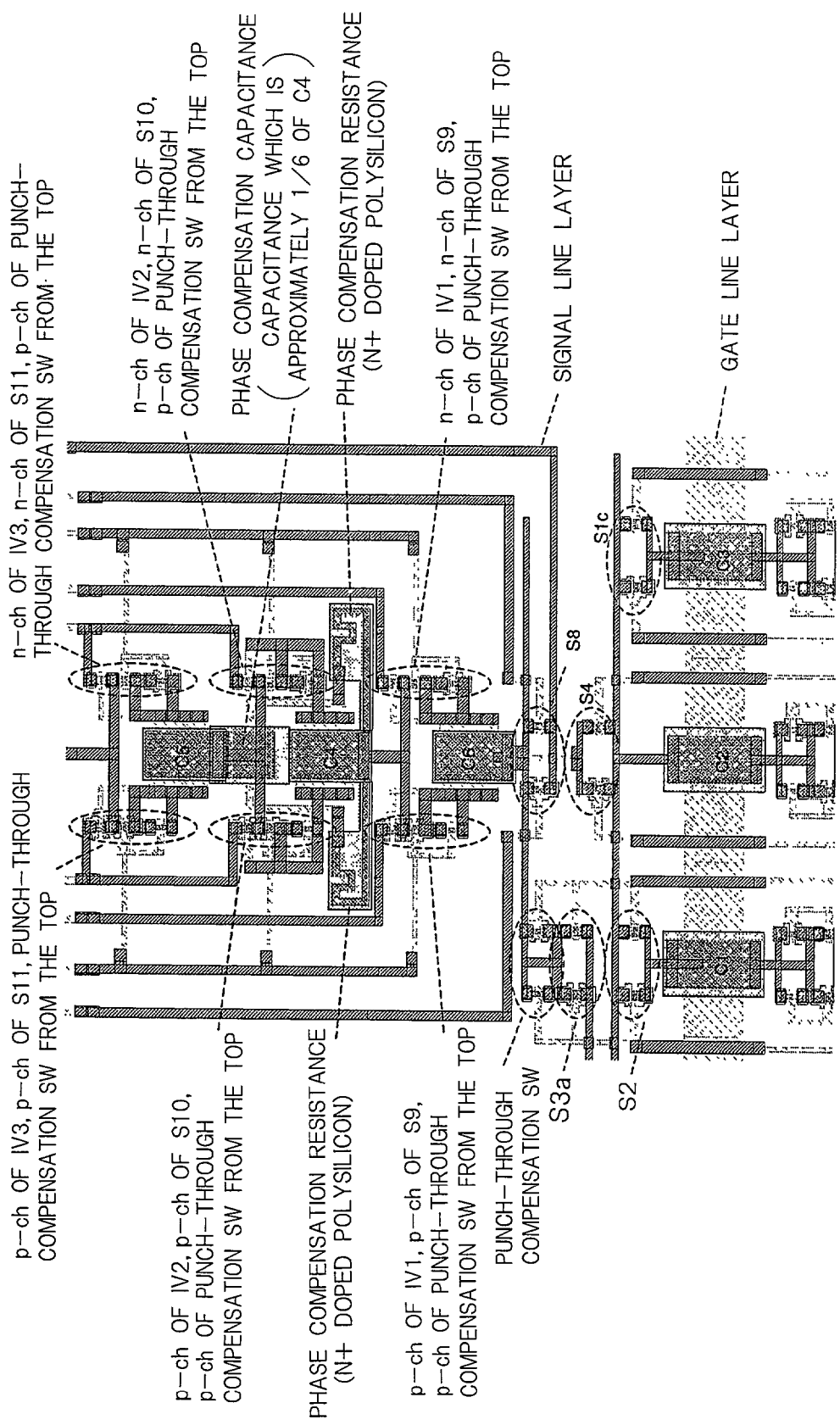
FIG. 39 is a layout view of the part of the AMP in FIG. 3.

FIG. 39 is a layout drawing of a part of the AMP 17 of FIG. 3. Reference numerals of switches and elements are given in accordance with those in FIG. 3.

In order to avoid oscillation or ringing, as a phase compensation element provided in front of or at the rear of the inverter on the second stage, one illustrated in FIG. 11 is used. As a resistance element, N$^+$ doped polysilicon is utilized. A capacitance element is formed by an intersection of the N$^+$ doped polysilicon and a gate line layer. In this display apparatus, a signal line capacity is 12 pF. A signal line resistance is 0.4 kΩ. A time constant of the drive load is 12 pF×0.8 kΩ=9.6 nsec. A resistance value of the phase compensation element is determined as 100 kΩ and a electrostatic capacitance is determined as 0.1 pF. A drive time per signal line is determined as 4 us.

In order to suppress an output voltage error caused due to a punch-through voltage of the analog switch, a punch-through compensation switch is arranged at each position as similar to FIG. 9.

As the analog switch or the inverter, both the P-channel TFT and the N-channel TFT are complementarily used. The symmetrical circuit arrangement is realized so that an unwanted parasitic capacitance can be evenly parasitic on the P-channel TFT and the N-channel TFT, thereby minimizing the influence.

Each of a capacitance elements C1, C2, C3 and C6 used for D/A conversion is formed by an intersection portion of the N$^+$ doped polysilicon layer and the gate line layer. It is desirable that these capacitances have the same electrostatic capacitance. That is because irregularities in the electrostatic capacitance are directly connected with an error voltage of D/A conversion. For example, in the C3, an intersection portion of the signal line layer and the gate line layer is partially used to realize the electrostatic capacitance which is equal to that of the C2 as much as possible.

Resistances between the respective inverters constituting the AMP 17 and the power supply are determined as Rm=360 Ω (XAVDD side)/220 Ω (XAVSS side), R1=70 Ω, R3=50 Ω, R2=35 Ω and R4=25 Ω which are denoted by reference numerals in FIG. 3.

A gate width ratio of the respective inverters of the AMP 17 is determined as IV1:IV2:IV3=6:6:5.

Figure 40:
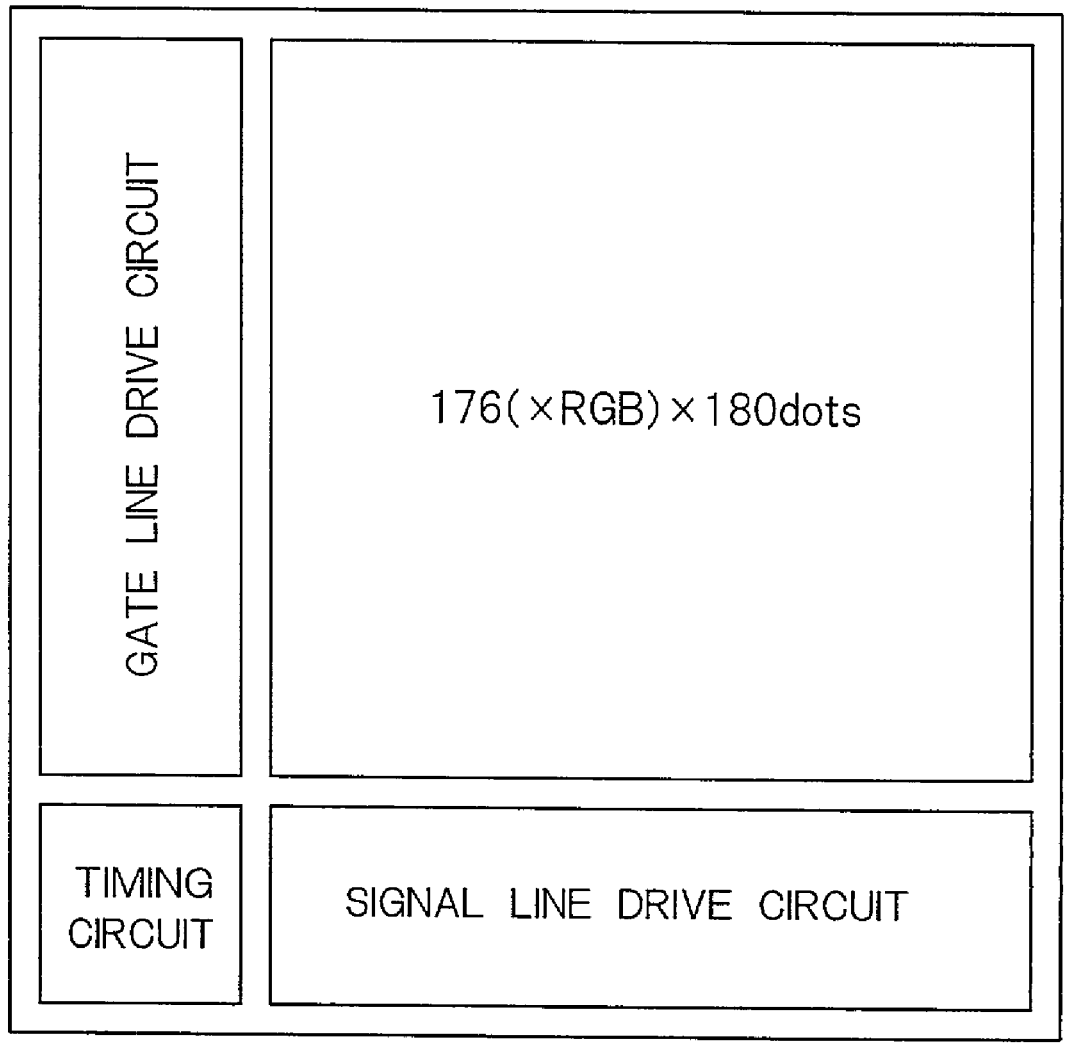
FIG. 40 is a layout view of a low-temperature polysilicon TFT array substrate in a 20th embodiment.

One of the two glass substrates constituting the liquid crystal cells is a color filter board on which a common electrode is formed. The common electrode is driven to cause polarity inversion in a cycle of one horizontal period. The other board is, as shown in FIG. 40, a low-temperature polysilicon TFT array board obtained by integrally forming a pixel array portion 1, a signal line drive circuit 5, a scanning line (gate line) drive circuit 6 and a timing circuit 7.

44 pairs of the AMP 17 and the DAC 16 are arranged in the signal line drive circuit 5, and this circuit operates so as to perform D/A conversion and signal line drive (operation shown in FIG. 4) by the AMP 17 for 12 times in one horizontal period and sequentially select 12 signal lines.

Figure 41:
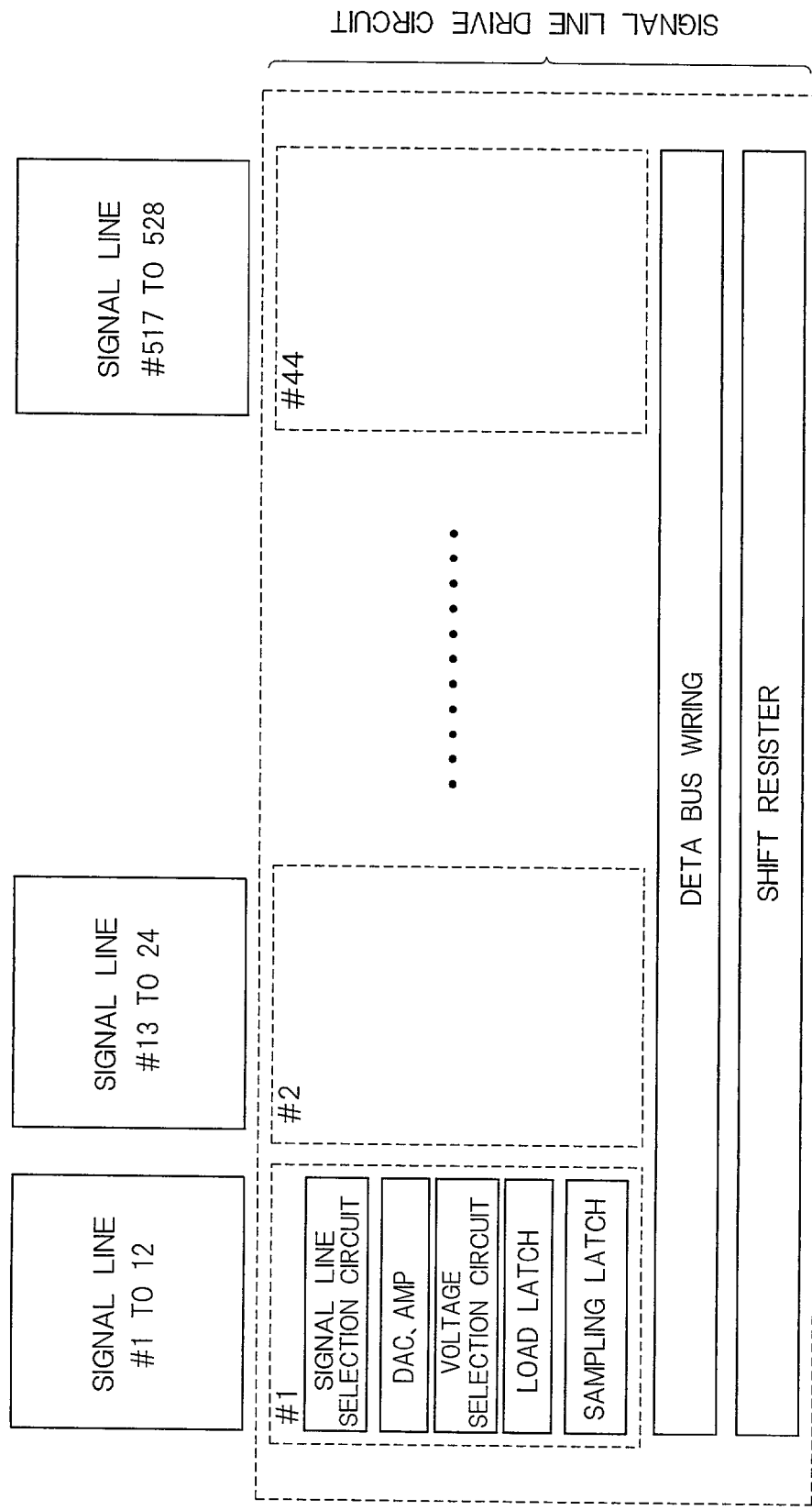
FIG. 41 is a schematic structural view showing the signal line drive circuit.

FIG. 41 is a schematic structural view of the signal line drive circuit 5. Further, the liquid crystal display apparatus according to this embodiment includes a power supply IC4 and an LCD controller illustrated in FIG. 34, and operates with power supply settings depicted in FIGS. 35 and 21.

With such a configuration, it is possible to perform excellent display which is superior in low power consumption and stability of the AMP 17 and has no problem in accuracy of D/A conversion. Furthermore, it is possible to assure the sufficient yield with respect to irregularities in Vth due to the erratic manufacturing process. Moreover, the apparatus operates in a wide range in which absolute values of Vth of the N-channel TFT and the P-channel TFT are respectively varies from 0.5 on the minimum level to approximately 2.5 V on the maximum level without incident.

(21st Embodiment)

The 21st embodiment assures a long signal line write time. The entire structure of the 21st embodiment is similar to that illustrated in FIG. 1, and a block structure of its signal line drive circuit is also similar to that depicted in FIG. 2.

A voltage division resistance ladder 20 in the signal line drive circuit 5 is constituted by connecting a plurality of non-illustrated resistance elements in series. As shown in FIG. 2, three types of reference voltages REF1, Vm and REF2 are supplied to the voltage division resistance ladder 20, and nine types of reference voltages V1 to V9 are fetched from stages of a plurality of resistance elements connected in series. It is desirable that Vm is close to (REF1+REF2)/2. That is because power consumption of the resistance ladder can be expressed as the square of (REF1−Vm)/square of (resistance between REF1 and Vm)+(Vm−REF2)/(resistance between Vm and REF2) and this value can be minimized.

The DAC 16 generates a voltage according to lower three bits in digital pixel data by using reference voltages Vr1 and Vr2 outputted from the voltage selection circuit 15. The voltage generated in the DAC 16 is amplified in the AMP 17 and then supplied to the signal line selection circuit 18.

Before supplying the voltage from the AMP 17 to a corresponding signal line, the signal line selection circuit 18 pre-charges the signal line. As pre-charge voltages, the reference voltages Vr1 and vr2 outputted from the voltage selection circuit 15 are used.

Figure 42:
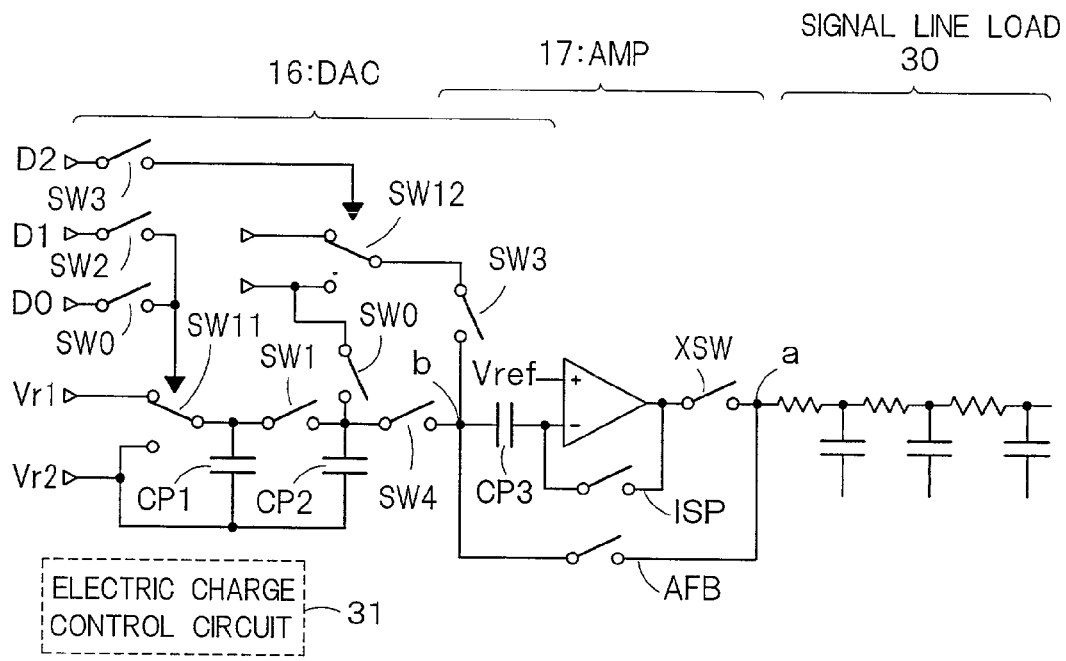
FIG. 42 is a circuit diagram showing a detailed structure of the DAC 16 and the AMP 17.

FIG. 42 is a circuit diagram showing a detailed structure of the DAC 16 and the AMP 17. As shown in the drawing, the DAC 16 has: a switch SW11 which selects one of the reference voltages Vr1 and Vr2 in accordance with values of two bits D1 and D0 in the lower three bits in digital pixel data excluding the most significant bit; a switch SW12 which selects one of the reference voltages Vr1 and Vr2 in accordance with a value of the most significant bit in the digital pixel data; a capacitor element (first capacitor element) CP1 capable of storing the electric charge according to a value of each bit other than the most significant bit in the digital pixel data; a capacitor element (second capacitor element) CP2 capable of redistributing the stored electric charge with the capacitor element CP1; a capacitor element (third capacitor element) CP3 capable of storing the electric charge according to a value of the most significant bit in the digital pixel data; a switch SW0 which is turned on when storing the electric charge according to a value of the least significant bit D0 in the digital pixel data into the capacitor element CP1; a switch (first switching circuit) SW1 which switches whether redistribution of the stored charge is carried out between the capacitor elements CP1 and CP2; a switch SW2 which is turned on when storing the electric charge according to a value of the bit D1 into the capacitor element CP1; a switch (second switching circuit) SW3 which is turned on when storing the electric charge according to a value of the bit D2 into the capacitor element CP3; and a switch (third switching circuit) SW4 which switches whether redistribution of the stored electric charge is performed between the capacitor elements CP2 and CP3.

The AMP 17 has: a differential amplifier 17a; a switch ISP connected between an inversion input terminal and an output terminal of the differential amplifier 17a; a switch AFB connected between a connection point a of the switch ISP and the signal line load 30 and a connection point b of the capacitor element CP3 and the switches SW3 and SW4.

The capacitor element CP3 is connected to the inversion input terminal of the differential amplifier 17a, and a reference voltage Vref is supplied to a normal input terminal.

Switching control over the above-described respective switches SW0 to SW3, SW11, SW12, ISP, AFB and XSW is carried out by the electric charge control circuit 31.

Figure 43:
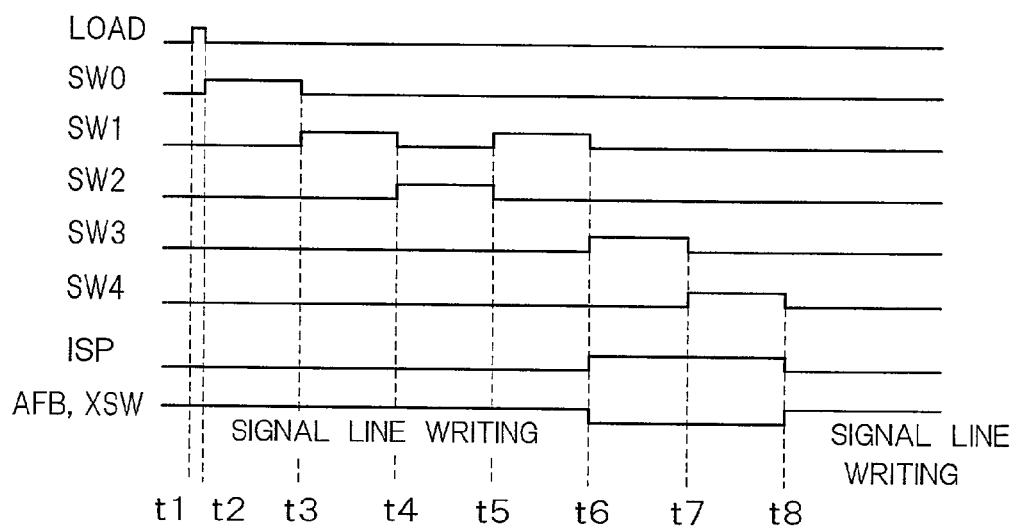
FIG. 43 is an operation timing chart of the DAC 16.

FIG. 43 is an operation timing chart of the DAC 16. The operation of the DAC 16 will now be described hereinafter with reference to the operation timing chart of FIG. 43. When a load signal is inputted at the time t1, digital pixel data D2 to D0 are inputted to the DAC 16. In a period from the time t2 to the time t3, the switch SW0 is turned on, and the electric charge according to a value of the bit DO in the digital pixel data is stored in the capacitor element CP1. Specifically, if the bit D0 is "1", the electric charge according to the reference voltage Vr1 is stored in the capacitor element CP1. If it is "0", the electric charge according to the reference voltage Vr2 is stored in the capacitor element CP1. In addition, the electric charge according to the reference voltage Vr2 is stored in the capacitor CP2.

In a period from the time t3 to the time t4, the switch SW1 is turned on, and redistribution of the electric charge is carried out between the capacitor elements CP1 and CP2. Thereafter, in a period from the time t4 to the time t5, the switch SW2 is turned on, and the electric charge according to a value of the bit D1 in the digital pixel data is stored in the capacitor element CP1.

Then, in a period from the time t5 to the time t6, the switch SW1 is turned on, and redistribution of the electric charge is performed between the capacitor elements CP1 and CP2. As a result, the electric charges according to values of the bits D1 and D0 are stored in the capacitor elements CP1 and CP2.

Until the time t6, the switches AFB and XSW remain the on state, and the voltage according to the electric charge stored in the capacitor element CP3, namely, a voltage Vold according to the immediately preceding digital pixel data is supplied to the signal line load 30. Additionally, the switch ISP between the input and output terminals of the AMP 17 is in the off state and keeps supplying Vold to the signal line until the time t6.

Thereafter, in a period from the time t6 to the time t7, the switch SW3 is turned on, and the electric charge according to a value of the bit D2 is stored in the capacitor element CP3. Further, the switch ISP is turned on as a result of the fact that the switches AFB and XSW are turned off, and the AMP 17 operates so as to charge the operation threshold voltage of the AMP 17 to the right end of the capacitor element CP3.

Then, in a period from the time t7 to the time t8, the switch SW4 is turned on. Consequently, redistribution of the stored electric charge is performed between the capacitor elements CP2 and CP3. As a result, the electric charges according to values of the bits D0 to D2 in the digital pixel data are stored in the capacitor elements CP2 and CP3, and a voltage Vnew is obtained At this moment, since the switch ISP is in the on state while the switch XSW is in the off state, the AMP 17 does not output the voltage according to the stored electric charge of the capacitor element CP3.

As described above, the electric charge according to values of the bits D0 to D2 in the digital pixel data is stored in the left end of the capacitor element CP3, the voltage Vnew is charge, and the operation threshold voltage of the AMP 17 is charged in the right end of the capacitor element CP3, thereby completing the sampling operation of the AMP 17.

After the time t8, the switch ISP is turned off while the switches XSW and AFB are turned on, and a voltage according the stored electric charge of the capacitor element CP3 performs the write operation for supply to the signal line load 30. That is, the AMP 17 continues writing a current in a predetermined direction into the signal line load until the voltage which is fed back to the left end of the capacitor element CP3 through the analog switch AFB becomes equal to Vnew.

Figure 44:
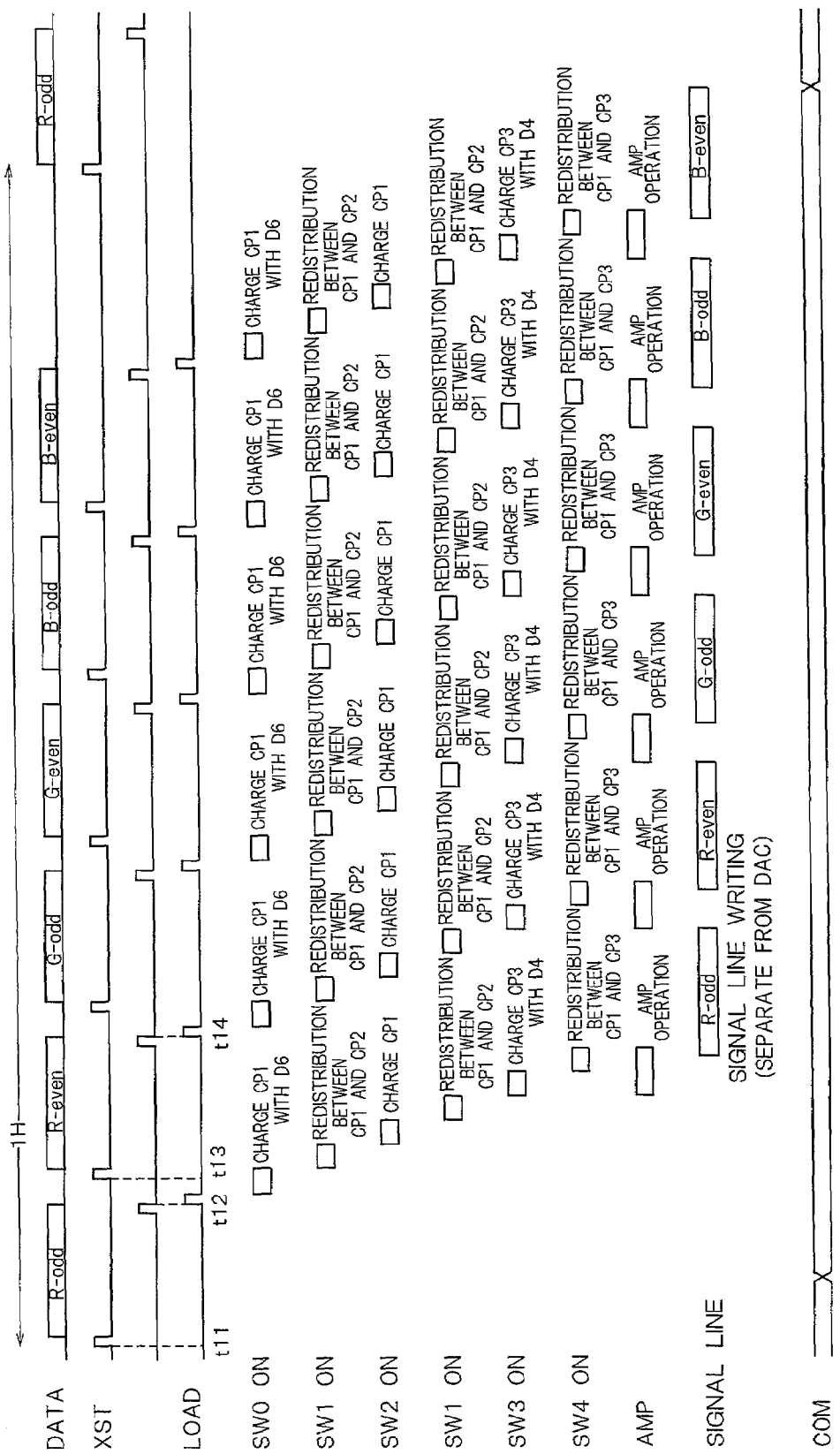
FIG. 44 is an operation timing chart of the signal line drive circuit 5 according to the embodiment.

FIG. 44 is an operation timing chart of the signal line drive circuit 5 according to this embodiment. At the time t11, when a start pulse XST is supplied, a sampling latch 13 sequentially latches red odd number of pixels. Then, at the time t12 when latching of the red odd number of pixels for one horizontal line is completed, a load latch 14 simultaneously latches all of the red odd number of pixels for one horizontal line. An output from the load latch 14 is inputted to the DAC 16 and D/A conversion is carried out.

Concurrently with the D/A conversion operation in the DAC 16 with respect to the red odd number of pixels, the sampling latch 13 latches red even number of pixels for one horizontal line (the time t13 to the time t14). Thereafter, the sampling latch 13 sequentially latches green odd number of pixels, green even number of pixels, blue odd number of pixels and blue even number of pixels for one horizontal line.

The signal line drive circuit 5 according to this embodiment performs H common inversion drive by which the voltage of the common electrode is inverted in accordance with one horizontal period (1 H).

FIG. 45 is a circuit diagram of the signal line drive circuit showing an example of H common inversion drive. As shown in the drawing, circuits 5b are repeatedly provided at predetermined intervals in the signal line drive circuit 5.

In the circuit 5b, the sampling latch 13 latches the digital pixel data in synchronization with a shift clock from the shift register 11.

Subsequently, the sampling latch 13 re-latches the latch data after level shift. A upper three-bit D/A in the DAC 16 selects a reference voltage based on upper three bits in the latch data of the sampling latch 13, and an lower three-bit D/A performs D/A conversion of lower three bits in the latch data of the sampling latch 13 by using the selected reference voltage.

An analog video signal subjected to D/A conversion is sampled in the AMP 17, and then supplied to a corresponding signal line through the signal line selection circuit 18.

As described above, in this embodiment, the sufficiently long signal line write time can be assured by partially overlapping the timing of the D/A conversion operation by the DAC 16 and the timing of the sampling operation by the AMP 17. Therefore, the DAC 16 or the AMP 17 can be shared by a plurality of signal lines, thereby reducing the circuit scale.

In the foregoing embodiments, although description has been given on the example of the DAC 16 used in the signal line drive circuit 5 of the liquid crystal display apparatus, the digital-to-analog conversion circuit according to the present invention can be applied to various kinds of applications. Further, the operation timing of the signal line drive circuit 5 is not restricted to those illustrated in FIG. 44. Furthermore, as to the polarity inversion drive of the signal line drive circuit 5, any mode other than the H common inversion drive, e.g., V common inversion drive may be adopted.

Figure 46:
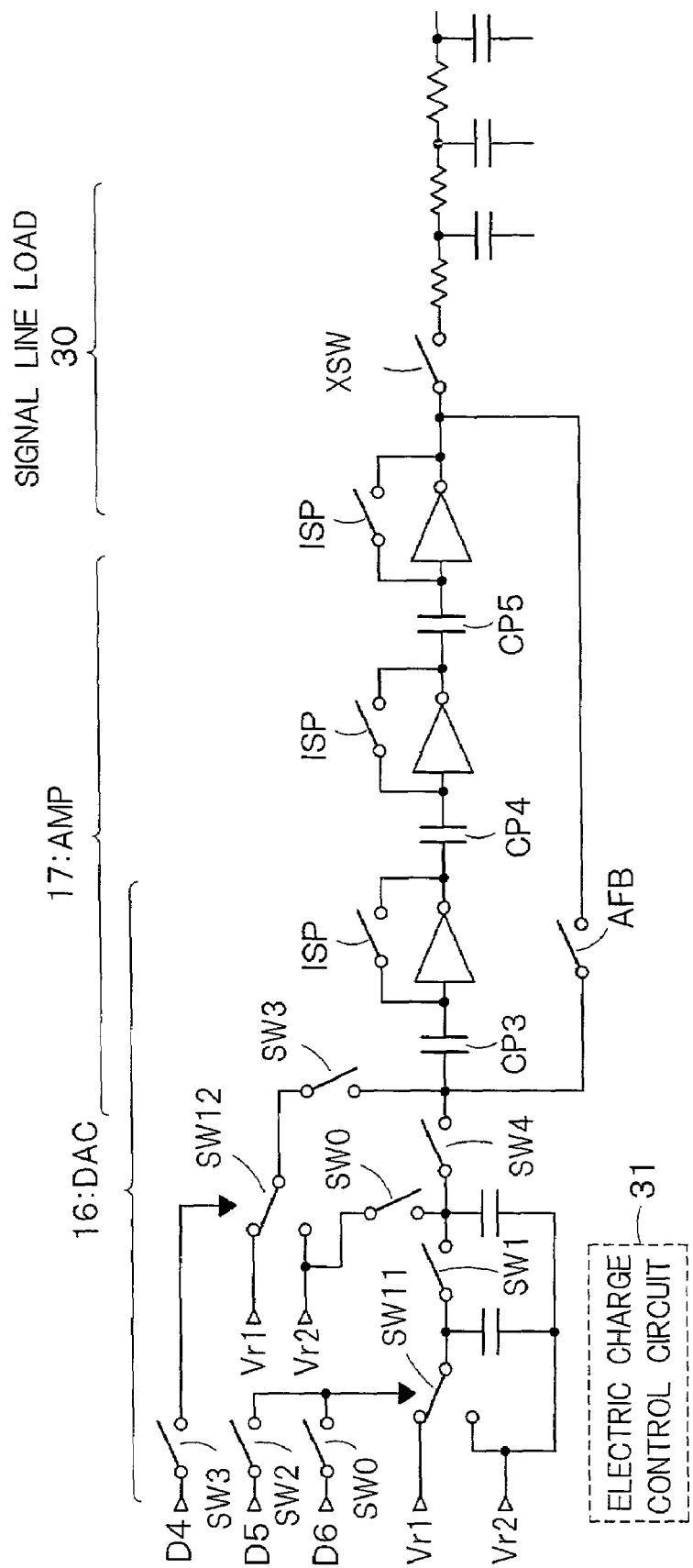
FIG. 46 is a circuit diagram of the DAC connected to the AMP having no differential amplifier.

Moreover, as the AMP 17, any amplifier other than the differential amplifier may be used. For example, it may be an inverter constituted by connecting the p-channel transistor and the n-channel transistor in series between the power supplies. In this case, the Vref terminal is eliminated. In this case, the circuit of the DAC 16 is as shown in FIG. 46. The capacitor element CP3 illustrated in FIG. 46 acts as a comparator which compares the voltage sampled in the capacitor element CP3 in a period from the time t7 to the time 8 in FIG. 43 with a signal line potential which is inputted (fed back) to the capacitor CP3 through the analog switch AFB after the time t8. In addition, in order to increase the voltage output accuracy of the AMP 17, it is effective to use a plurality of comparators connected in series.

It is to be noted that the operation stability of the AMP circuit is assured by providing the phase compensation element shown in FIGS. 10 to 13 to a middle inverter among three inverters connected in series depicted in FIG. 46 as described above.

What is claimed is:

1. A display apparatus comprising:
   signal lines and scanning lines which are vertically and horizontally provided in rows on an insulation substrate;
   display elements formed in the vicinity of the respective intersections of said signal lines and said scanning lines;
   a scanning line drive circuit which drives said scanning lines; and
   a signal line drive circuit which is formed on said insulation substrate and drives said signal lines, said signal line drive circuit having:
   an amplifier which amplifies an analog video signal; and
   a signal line selection circuit which selects a signal line to which said analog video signal amplified in said amplifier is supplied, said amplifier having:
   an odd number of inverters which are cascade-connected;
   first capacitor elements each of which is connected between stages of said inverters and between an input terminal of said inverter on a first stage and an output terminal of said inverter on a last stage;
   a first power supply line which supplies a power supply voltage to said inverter on said first stage; and
   a second power supply line which supplies a power supply voltage to said inverters on stages other than said first stage.

2. The display apparatus according to claim 1, further comprising impedance elements which are individually inserted to said first and second power supply lines.

3. A display apparatus comprising:
   signal lines and scanning lines vertically and horizontally provided in rows on an insulation substrate;
   display elements which are formed in the vicinity of the respective intersections of said signal lines and said scanning lines;
   a scanning line drive circuit which drives said scanning lines; and
   a signal line drive circuit which is formed on said insulation substrate and drives said signal lines,
   said signal line drive circuit having:
   an amplifier which amplifies an analog video signal; and
   a signal line selection circuit which selects a signal line to which said analog video signal amplified by said amplifier is supplied,
   said amplifier having:
   a power supply line and a ground line;
   three inverters which are cascade-connected;
   resistance elements provided between said inverters and said power supply line;
   resistance elements provided between said inverters and said ground line;
   a first capacitor element which is connected between an input terminal of said inverter on a first stage and an output terminal of said inverter on a last stage;

a switching circuit which is provided to said inverter on said first stage and capable of switching whether input and output terminals of said inverter on said first stage are short- circuited; and a phase compensation impedance element which is inserted between input and output terminals of said inverter on a second stage.

4. The display apparatus according to claim 3, wherein said amplifier has:

capacitor elements respectively connected between said three inverters which are cascade-connected; and switching circuits each of which is provided to said respective three inverters and capable of switching whether input and output terminals of a corresponding inverter are short-circuited.

5. The display apparatus according to claim 3, wherein a product of a resistance value and a capacitance value of said phase compensation impedance element is substantially equal to a value of a product of a signal line load capacitance and a signal line resistance.

6. The display apparatus according to claim 3, wherein a value of said inverter (gate width/gate length) on a second stage is larger than a value of said inverter on a third stage.

7. A display apparatus comprising:

an insulation substrate having signal lines and scanning lines which are vertically and horizontally provided in rows, display elements which are formed in the vicinity of the respective intersections of said signal lines and said scanning lines, a scanning line drive circuit which drives said scanning lines, a signal line drive circuit which is formed on said insulation substrate and drives said signal lines;

an opposed substrate which is oppositely arranged on said insulation substrate and to which a common electrode is formed, said signal line drive circuit having:

an amplifier which amplifies an analog video signal; and a signal line selection circuit which selects a signal line to which said analog video signal amplified by said amplifier is supplied, said amplifier having an odd number of inverters which are cascade-connected and maximizing a gain of each inverter in the vicinity of a voltage where the inclination of a voltage-brightness characteristic curve of said display elements becomes maximums wherein said amplifier is constituted by cascade-connecting an odd number of inverters, and each of said inverters is a complementary inverter having a pMOS transistor and an nMOS transistor which are connected between first and second power supply voltages in series.

8. A display apparatus comprising:

signal lines and scanning lines which are vertically and horizontally provided in rows on an insulation substrate;

display elements which are formed in the vicinity of the respective intersections of said signal lines and said scanning lines;

a scanning line drive circuit which drives said scanning lines; and a signal line drive circuit which is formed on said insulation substrate and drives said signal lines, said signal line drive circuit having:

an amplifier which amplifies an analog video signal; and a signal line selection circuit which selects a signal line to which said analog video signal amplified by said amplifier is supplied, said amplifier having inverters on (2n+1) stages (where n is an integer not less than 1) which are cascade-connected, and capacitor elements respectively connected between said (2n+1) stages of said inverters and between an input terminal of said inverter on a first stage and an output terminal of said inverter on a last stage, a size of each transistor constituting said inverters from a second stage to a 2n-th stage being larger than a size of a transistor constituting said inverter on a last stage, and a size of each transistor constituting said inverter on a first stage being equal to or smaller than a size of a transistor constituting said inverter on said second stage.

9. The display apparatus according to claim 8, wherein a size of said transistor is a ratio of a gate width of said transistor relative to a gate length of the same.

10. A display apparatus comprising:

signal lines and scanning lines which are vertically and horizontally provided in rows on an insulation substrate;

display elements which are formed in the vicinity of the respective intersections of said signal lines and said scanning lines;

a scanning line drive circuit which drives said scanning lines; and a signal line drive circuit which is formed on said insulation substrate and drives said signal lines, said signal line drive circuit having:

an amplifier which amplifies an analog video signal; and a signal line selection circuit which selects a signal line to which said analog video signal amplified by said amplifier is supplied, said amplifier having:

a power supply line and a ground line;

inverters on (2n+1) stages (where n is an integer not less than 1) which are cascade- connected;

capacitor elements which are respectively connected between said (2n+1) stages of said inverters and between an input terminal of said inverter on a first stage and an output terminal of said inverter on a last stage; and a plurality of impedance elements respectively connected to said power supply line and said odd number of inverters, an impedance value of said impedance elements respectively connected to said inverters from a second stage to a 2n-th stage being not more than an impedance value of said impedance element connected to said inverter on a last stage, and an impedance value of said impedance element connected to said inverter on a first stage being not less than an impedance value of said impedance element connected to said inverter on said second stage.

11. A display apparatus comprising:

signal lines and scanning lines which are vertically and horizontally provided in rows on an insulation substrate;

display elements which are formed in the vicinity of the respective intersections of said signal line and said scanning line;

a scanning line drive circuit which drives said scanning lines; and a signal line drive circuit which is formed on said insulation substrate and drives said signal lines, said signal line drive circuit having:

a latch circuit which latches digital pixel data;

a D/A converter which converts a latch output from said latch circuit into an analog video signal;

an amplifier which amplifies said analog video signal converted by said D/A converter; and a signal line selection circuit which selects a signal line to which said analog video signal amplified by said amplifier is supplied, said amplifier having:

inverters on (2n+1) stages (where n is an integer not less than 1) which are cascade- connected; and capacitor elements respectively connected between said (2n+1) stages of said inverters and between an input terminal of said inverter on a first stage and an output terminal of said inverter on a last stage, each of said inverters on said (2n+1) stages having first and second power supply terminals, a reference voltage which differs in accordance with each of said inverters on said (2n−1) stages being supplied to at least one of said first and second power supply terminals, a reference voltage which is supplied to at least one of said first and second power supply terminals of each of said inverters from said second stage to said 2n-th stage being not less than a reference voltage supplied to at least one of said first and second power supply terminals of said inverter on said last stage, and a reference voltage supplied to at least one of said first and second power supply terminals of said inverter on said first stage being not more than a reference voltage supplied to at least one of said first and second power supply terminals of said inverter on said second stage.

12. A display apparatus comprising:

signal lines and scanning lines which are vertically and horizontally provided in rows on an insulation substrate;

display elements which is formed in the vicinity of the respective intersections of said signal lines and said scanning lines;

a scanning line drive circuit which drives said scanning lines; and a signal line drive circuit which is formed on said insulation substrate and drives said signal lines, said signal line drive circuit having:

an amplifier which amplifies an analog video signal; and a signal line selection circuit which selects a signal line to which said analog video signal amplified by said amplifier is supplied, and performs signal line writing, said amplifier having:

a plurality of first amplification portions each of which is constituted by one or more inverters, and which are connected to each other in parallel;

a second amplification portion consisting of a plurality of inverters which are cascade- connected;

a selection portion which sequentially selects any one of a plurality of said first amplification portions, supplies an output of a selected first amplification portion to an inverter on a first stage of said second amplification portion, and feeds back an output of said second amplification portion to an input side of an inverter on a first stage of said selected first amplification portion in order to form a closed loop; and a plurality of capacitor elements which are respectively connected between stages of respective inverters in said closed loop, said amplifier amplifying an analog video signal corresponding to a next signal line to which writing is performed while said signal line selection circuit is performing signal line writing.

13. The display apparatus according to claim 12, wherein each of a plurality of said first amplification portions has first and second inverters connected in parallel, said selection portion having:

a first switching portion which switches whether an output terminal of said first inverter and an input terminal of said second amplification portion are connected with said capacitor element sandwiched therebetween;

a second switching portion which switches whether an input terminal of said first inverter and an output terminal of said second amplification portion are connected with said capacitor element sandwiched therebetween;

a third switching portion which switches whether an output terminal of said second inverter and an input terminal of said second amplification portion are connected with said capacitor element sandwiched therebetween;

a fourth switching portion which switches whether an input terminal of said second inverter and an output terminal of said second amplification are connected with said capacitor element sandwiched therebetween, said amplifier alternately performing formation of a closed loop including said first inverter and formation of a closed loop including said second inverter every time said signal line selection circuit performs signal line writing.

14. The display apparatus according to claim 12, wherein, immediately after supplying an output from one of said first and second inverters to said second amplification portion by turning on said second or fourth switching portion, an analog video signal which is to be subsequently written is supplied to the other one of said first and second inverters by turning on said first or third switching portion.

* * * * *